United States Patent
Minegishi et al.

(10) Patent No.: US 8,420,291 B2
(45) Date of Patent: Apr. 16, 2013

(54) POSITIVE PHOTOSENSITIVE RESIN COMPOSITION, METHOD FOR FORMING PATTERN, ELECTRONIC COMPONENT

(75) Inventors: Tomonori Minegishi, Ibaraki (JP); Tomoko Kawamura, Ibaraki (JP); Masayuki Ohe, Ibaraki (JP); Yuki Nakamura, Ibaraki (JP)

(73) Assignee: Hitachi Chemical Dupont Microsystems, Ltd., Tokyo (JP)

( * ) Notice: Subject to any disclaimer, the term of this patent is extended or adjusted under 35 U.S.C. 154(b) by 325 days.

(21) Appl. No.: 12/739,127

(22) PCT Filed: Oct. 29, 2008

(86) PCT No.: PCT/JP2008/069652
§ 371 (c)(1),
(2), (4) Date: Apr. 21, 2010

(87) PCT Pub. No.: WO2009/057638
PCT Pub. Date: May 7, 2009

(65) Prior Publication Data
US 2010/0258336 A1 Oct. 14, 2010

(30) Foreign Application Priority Data
Oct. 29, 2007 (JP) .................................. 2007-280501

(51) Int. Cl.
*H05K 1/00* (2006.01)
*G03F 7/20* (2006.01)

(52) U.S. Cl.
USPC .................... 430/270.1; 430/326; 174/250

(58) Field of Classification Search .............. 430/270.1, 430/326; 174/250
See application file for complete search history.

(56) References Cited

U.S. PATENT DOCUMENTS

| | | | |
|---|---|---|---|
| 3,957,512 A | 5/1976 | Kleeberg et al. | |
| 4,040,831 A | 8/1977 | Rubner et al. | |
| 4,093,461 A | 6/1978 | Loprest et al. | |
| RE30,186 E | 1/1980 | Rubner et al. | |
| 4,339,521 A | 7/1982 | Ahne et al. | |
| 4,395,482 A | 7/1983 | Ahne et al. | |
| 4,629,777 A | 12/1986 | Pfeifer | |
| 4,657,832 A | 4/1987 | Pfeifer | |
| 4,927,736 A | 5/1990 | Mueller et al. | |
| 5,019,488 A | 5/1991 | Mammato et al. | |
| 5,037,720 A | 8/1991 | Khanna | |
| 5,106,720 A | 4/1992 | Mueller et al. | |
| 5,342,739 A | 8/1994 | Katou et al. | |
| 5,486,447 A | 1/1996 | Hammerschmidt et al. | |
| 5,738,915 A | 4/1998 | Fathi et al. | |
| 6,143,467 A | 11/2000 | Hsu et al. | |
| 6,338,931 B1 | 1/2002 | Maeda et al. | |
| 6,576,394 B1 | 6/2003 | Xu et al. | |
| 6,884,567 B2 | 4/2005 | Sezi | |
| 6,887,643 B2 | 5/2005 | Fujita et al. | |
| 6,929,891 B2 | 8/2005 | Rushkin et al. | |
| 6,933,087 B2 | 8/2005 | Suwa et al. | |
| 7,049,371 B2 | 5/2006 | Enoki et al. | |
| 7,129,011 B2 | 10/2006 | Rushkin et al. | |
| 7,132,205 B2 | 11/2006 | Rushkin et al. | |
| 7,435,525 B2 | 10/2008 | Hattori et al. | |
| 7,485,405 B2 | 2/2009 | Kato et al. | |
| 7,615,331 B2 * | 11/2009 | Yamanaka et al. | ......... 430/270.1 |
| 7,803,510 B2 | 9/2010 | Naiini et al. | |
| 2001/0031419 A1 | 10/2001 | Nunomura et al. | |
| 2002/0115741 A1 | 8/2002 | Kobayashi et al. | |
| 2003/0022109 A1 | 1/2003 | Kobayashi | |
| 2003/0194631 A1 | 10/2003 | Suwa et al. | |
| 2004/0110084 A1 | 6/2004 | Inomata et al. | |
| 2004/0142275 A1 | 7/2004 | Komatsu | |
| 2004/0229166 A1 | 11/2004 | Rushkin et al. | |
| 2004/0253537 A1 | 12/2004 | Rushkin et al. | |
| 2006/0079658 A1 | 4/2006 | Kato et al. | |
| 2006/0110680 A1 | 5/2006 | Taniguchi et al. | |
| 2006/0199920 A1 | 9/2006 | Okada et al. | |
| 2007/0122733 A1 | 5/2007 | Hattori et al. | |

FOREIGN PATENT DOCUMENTS

| | | |
|---|---|---|
| JP | SHO49011551 | 2/1974 |
| JP | 49-115541 A | 11/1974 |
| JP | 51-40922 A | 4/1976 |
| JP | 52-13315 A | 2/1977 |
| JP | 54-145794 A | 11/1979 |
| JP | 56-38038 A | 4/1981 |
| JP | 59-108031 A | 6/1984 |
| JP | 59-132122 A | 7/1984 |

(Continued)

OTHER PUBLICATIONS

International Search Report issued in corresponding application No. PCT/JP2006/312358, completed Aug. 10, 2006 and mailed Aug. 22, 2006.
International Search Report issued in the corresponding Japanese Application No. PCT/JP2006/312357, completed Jul. 12, 2006 and mailed on Jul. 25, 2006.
International Search Report, issued in corresponding application No. PCT/JP2008/054008, completed Mar. 21. 2008, mailed Apr. 1, 2008.
Office Action in co-pending U.S. Appl. No. 12/067,911 mailed Jun. 8, 2011.
Office Action in U.S. Appl. No. 12/067,911 dated Sep. 17, 2010.
Office Action in U.S. Appl. No. 13/305,668 mailed Oct. 17, 2011.
Office Action in U.S. Appl. No. 12/067,911 dated Dec. 16, 2011.
Okuda, R., et al., "Polyimide Coatings for OLED Applications," Journal of Photopolymer Science and Technology, vol. 17, No. 2, 2004, pp. 207-214.

(Continued)

*Primary Examiner* — Robert D. Harlan
(74) *Attorney, Agent, or Firm* — Griffin & Szipl, P.C.

(57) ABSTRACT

Provided are a positive photosensitive resin composition that is developable in an alkaline aqueous solution and gives a good shaped pattern that is excellent in heat resistance and mechanical property, a method for producing the pattern and an electronic component. The positive photosensitive resin composition contains (a) polybenzoxazole or a polybenzoxazole precursor polymer having a structural unit represented by either a general formula (1) or (2) and satisfying conditions (i) and/or (ii), (b) a compound that generates an acid by being irradiated with active light ray and (c) a compound having a structure represented by a general formula (3) crosslinkable or polymerizable with said component (a).

5 Claims, 3 Drawing Sheets

FOREIGN PATENT DOCUMENTS

| | | |
|---|---|---|
| JP | 59-219330 A | 12/1984 |
| JP | 59-220730 A | 12/1984 |
| JP | 59-231533 A | 12/1984 |
| JP | 59-232122 A | 12/1984 |
| JP | 60-6729 A | 1/1985 |
| JP | 60-072925 A | 4/1985 |
| JP | 61-57620 A | 3/1986 |
| JP | 64-60630 A | 1/1989 |
| JP | 64-46862 U | 3/1989 |
| JP | 64-60630 A | 3/1989 |
| JP | 1-46862 B2 | 10/1989 |
| JP | 64-46862 A | 10/1989 |
| JP | 3-763 A | 1/1991 |
| JP | 4-31861 A | 2/1991 |
| JP | 3-58048 | 3/1991 |
| JP | 3-259148 A | 11/1991 |
| JP | 4-31861 A | 2/1992 |
| JP | 4-46345 A | 2/1992 |
| JP | 5-140922 A | 6/1993 |
| JP | 5-197153 A | 8/1993 |
| JP | 5-213315 A | 8/1993 |
| JP | 60-72925 A | 3/1994 |
| JP | 6-157620 A | 6/1994 |
| JP | 7-219228 A | 8/1995 |
| JP | 2587148 B2 | 12/1996 |
| JP | 9-183846 A | 7/1997 |
| JP | 10-186664 A | 7/1998 |
| JP | 10-195294 A | 7/1998 |
| JP | 10-282668 A | 10/1998 |
| JP | 10-307393 A | 11/1998 |
| JP | 11-149161 A | 6/1999 |
| JP | 11-153866 A | 6/1999 |
| JP | 11-202488 A | 7/1999 |
| JP | 11-202489 A | 7/1999 |
| JP | 11-254850 A | 9/1999 |
| JP | 3031434 B2 | 2/2000 |
| JP | 2000-147764 A | 5/2000 |
| JP | 2000-199957 A | 7/2000 |
| JP | 2000-250209 A | 9/2000 |
| JP | 2001-56559 A | 2/2001 |
| JP | 2001-0333964 A | 2/2001 |
| JP | 2001-125267 A | 5/2001 |
| JP | 2001-183835 A | 7/2001 |
| JP | 2001-194791 A | 7/2001 |
| JP | 2001-249454 A | 9/2001 |
| JP | 2001-255666 A | 9/2001 |
| JP | 2001-312051 A | 11/2001 |
| JP | 2002-139835 A | 5/2002 |
| JP | 2002-169286 A | 6/2002 |
| JP | 2002-526793 A | 8/2002 |
| JP | 2002-249646 A | 9/2002 |
| JP | 2002-328472 A | 11/2002 |
| JP | 2003-121998 A | 4/2003 |
| JP | 2003-215802 A | 7/2003 |
| JP | 2004-503830 A | 2/2004 |
| JP | 2004-94118 A | 3/2004 |
| JP | 2004-219813 A | 8/2004 |
| JP | 2004-325616 A | 11/2004 |
| JP | 2006-133757 A | 5/2006 |
| JP | 2006-176059 A | 7/2006 |
| JP | 2006-178059 A * | 7/2006 |
| JP | 2006-189788 A | 7/2006 |
| JP | 2006-285037 A | 10/2006 |
| JP | 2006-349700 A | 12/2006 |
| JP | 2007-156243 A | 6/2007 |
| JP | 2007-183388 A | 7/2007 |
| JP | 2007-212602 A | 8/2007 |
| JP | 2007-240554 A | 9/2007 |
| JP | 2007-246440 A | 9/2007 |
| JP | 2007-256525 A | 10/2007 |
| JP | 2007-322935 A | 12/2007 |
| WO | 00/19273 | 4/2000 |
| WO | 0196960 A1 | 12/2001 |
| WO | 2004/081664 A2 | 9/2004 |
| WO | 2005-109099 A1 | 11/2005 |
| WO | 2007-034604 A1 | 3/2007 |

OTHER PUBLICATIONS

Partial English translation of Office Action issued in corresponding Japanese Application No. 2005-276496, mailed Feb. 23, 2010.

Watanabe, Yasufumi et al., "Three-Component Negative-Type Photosensitive Polyimide Precursor Based on Poly (amid acid), a Crosslinker, and a Photoacid Generator," Journal of Polymer Science: Part A: Polymer Chemistrym vol. 43, 2005, pp. 593-599.

Watanabe, Yasufumi, et al. "New Negative-Type Photosensitive Alkaline-developable Semi-aromatic Polymides with Low Dielectric Constants Based on Poly(amic acid) from Aromatic Diamine Containing Adamantyl Units and Alicyclic Dianhydrides, a Cross-linker, and a Photoacid Generator," Polymer Journal, vol. 37, 2005, pp. 270-276.

Written Opinion of the International Searching Authority (PCT/ISA/237) issued in the corresponding application No. PCT/JP2006/312357 dated Jul. 25, 2006.

Yoshio Imai et al., "Saishin Polyimide-Kiso to Ouyou," Nippon Polyimide Kenkyukai, citing Characteristics of Polyimide as Electronic Material, Jan. 2002.

International Search Report, issued in corresponding application PCT/JP2008/069652, completed Nov. 18, 2008, mailed Dec. 2, 2008.

Office Action in U.S. Appl. No. 12/531,055 dated Dec. 9, 2011.

Office Action in U.S. Appl. No. 13/305,668 dated Jan. 30, 2012.

Office Action in U.S. Appl. No. 12/531,055 dated Jan. 12, 2012.

S. Kubota et al., "Positive Photoreactive Polyimides. II. Preparation and Characterization of Polyimide Precursors Containing . . . ", J. Macromol. Sci.-Chem., A24 (12), pp. 1407-1422, (1987).

T. Omote et al.,"Fluorine-Containing Photoreactive Polyimides. 7. Photochemical Reaction of Pendant 1,2-Naphthoquinone Diazide Moieties in Novel Photoreactive Polyimides," Macromolecules 1990, 23, pp. 4796-4802.

Mitsuru Ueda et al., "A New Negative-Type Photosensitive Polyimide Based on Poly(hydroxyimide), a Cross-Linker, and a Photoacid Generator," Macromolecules 1996, 29, pp. 6427-6431.

Espacenet Bibliographic data corresponding to JP 2007-322935 (2008), last updated Mar. 14, 2012. (Filed in co-pending U.S. Appl. No. 12/531,055 on Mar. 8, 2012 with Amendment B as Exhibit A1).

Espacenet Bibliographic data corresponding to the JP 2002-249646, last updated Mar. 14, 2012 (Filed in co-pending U.S. Appl. No. 12/531,055 on Mar. 8, 2012 with Amendment B as Exhibit B1).

JP 2002-249646 A (Filed in co-pending U.S. Appl. No. 12/531,055 on Mar. 8, 2012 with Amendment B as Exhibit C1).

Extended European Search Report issued in related application 08721728.4, completed Jun. 29, 2012 and mailed Jul. 11, 2012.

Notice of Rejection issued in co-pending related Japanese application 2008-278104 on Aug. 15, 2012 and mailed Aug. 21, 2012.

Notice of Rejection issued in co-pending related Japanese application 2008-278105 on Aug. 15, 2012 and mailed Aug. 21, 2012.

Notice of Rejection issued in co-pending related Japanese application 2009-539089 on Aug. 15, 2012 and mailed Aug. 21, 2012.

Final Office Action issued in co-pending related U.S. Appl. No. 13/006,300 on Sep. 5, 2012.

Non-Final Office Action issued in co-pending related U.S. Appl. No. 12/067,911 on Aug. 20, 2012.

* cited by examiner

POSITIVE PHOTOSENSITIVE RESIN COMPOSITION, METHOD FOR FORMING PATTERN, ELECTRONIC COMPONENT

This is a National Phase Application in the United States of International Patent Application No. PCT/JP2008/069652 filed Oct. 29, 2008, which claims priority on Japanese Patent Application No. 2007-280501, filed Oct. 29, 2007. The entire disclosures of the above patent applications are hereby incorporated by reference.

TECHNICAL FIELD

The present invention relates to a positive photosensitive resin composition, a method for producing a pattern and an electronic component, and more particularly relates to a heat resistant positive photosensitive resin composition containing a heat resistant polymer having a photosensitivity, as well as a method for producing a pattern and an electronic component using the same.

BACKGROUND ART

Conventionally, polyimide resins having excellent heat resistance, electric property and mechanical property have been used for surface protection films and interlayer insulation films for semiconductor elements. However, as semiconductor elements are being required to have higher integration and larger size in recent years, there is a demand for thin and small sealing resin packages. In order to meet the demand, a surface mounting system by LOC (lead on chip) and solder reflow are being employed, and there is an increasing demand for a polyimide resin that has ever better mechanical property and heat resistance.

A photosensitive polyimide obtained by imparting a photosensitive property to the polyimide resin itself has been recently used. Use of such a product realizes simple pattern production steps and shortening of the complicated production process. Conventional photosensitive polyimide, a heat resistant photoresist obtained by using a precursor thereof and their uses are well known. Concerning negative photosensitive polyimide, there are findings such as a method of introducing a methacryloyl group into a polyimide precursor through an ester bond or an ionic bond (e.g., see Patent Documents 1 to 4), soluble polyimide having photopolymerizable olefin (e.g., see Patent Documents 5 to 10), and self-sensitized type polyimide having a benzophenone skeleton and having an alkyl group at an ortho position of an aromatic ring to which a nitrogen atom is bound (e.g., see patent Documents 11 and 12).

Development of the aforementioned negative photosensitive polyimide requires an organic solvent such as N-methylpyrrolidone. Therefore, recently there has been a proposal of a positive photosensitive resin that can be developed in an alkaline aqueous solution. Concerning the positive photosensitive resins, there have been findings such as a method of introducing an o-nitrobenzyl group into a polyimide precursor through an ester bond (e.g., see Nonpatent Document 1), a method of mixing a naphthoquinone diazide compound with soluble hydroxylimine or a polyoxazole precursor (e.g., see Patent Documents 13 and 14), a method of introducing naphthoquinone diazide into soluble polyimide through an ester bond (e.g., see Nonpatent Document 2) and a method of mixing naphthoquinone diazide with an polyimide precursor (e.g., see Patent Document 15).

However, the aforementioned negative photosensitive polyimide has a problem with its resolution due to its mode of function. The negative photosensitive polyimide also causes a problem of possible reduced yield ratio upon production depending on its use. In addition, since possible structures of the aforementioned polyimide for use are limited, the variety in physical property of the finally obtained coating film is limited and therefore the negative photosensitive polyimide is not suitable for multipurpose uses. Meanwhile, as mentioned above, the positive photosensitive polyimide also has similar problems such as low sensitivity, low resolution and limitation on its structures due to its problem accompanied with absorption wavelength of the photosensitizing agents.

There are other products to which a phenolic hydroxyl group is introduced in place of carboxylic acid, e.g., a mixture of a polybenzoxazole precursor and a diazonaphthoquinone compound (see e.g., Patent Document 16) and a polyamide acid to which a phenol moiety is introduced through an ester bond (see e.g., Patent Document 17). However, these have an insufficient development property, and therefore cause film thickness reduction at a portion that are unexposed to light, and also cause delamination of the resin from the substrate. Aiming at improvement of the development property and adhesion, there has been proposed a product containing a polyamide acid having a siloxane moiety in a polymer skeleton (see e.g., patent Documents 18 and 19), although, as discussed above, addition of the polyamide acid deteriorates storage stability. In addition, aiming at improvement of storage stability and adhesion, there has also been proposed a product in which the amine terminal group is capped with a polymerizable group (see Patent Documents 20 to 22). However, since this product uses a diazoquinone compound containing abundant aromatic rings as an acid generator, the product has poor sensitivity. Then, since there is a necessity to add a large amount of diazoquinone compound, the mechanical physical property of that product after thermal curing is remarkably reduced. Thus, this product cannot be recognized as a material having a practical level of properties.

Patent Document 1: JP Sho-49-115541-A
Patent Document 2: JP Sho-51-40922-A
Patent Document 3: JP Sho-54-145794-A
Patent Document 4: JP Sho-56-38038-A
Patent Document 5: JP Sho-59-108031-A
Patent Document 6: JP Sho-59-220730-A
Patent Document 7: JP Sho-59-232122-A
Patent Document 8: JP Sho-60-6729-A
Patent Document 9: JP Sho-60-72925-A
Patent Document 10: JP Sho-61-57620-A
Patent Document 11: JP Sho-59-219330-A
Patent Document 12: JP Sho-59-231533-A
Patent Document 13: JP Sho-64-60630-A
Patent Document 14: U.S. Pat. No. 4,395,482
Patent Document 15: JP Sho-52-13315-A
Patent Document 16: JP Sho-64-46862-B
Patent Document 17: JP Hei-10-307393-A
Patent Document 18: JP Hei-4-31861-A
Patent Document 19: JP Hei-4-46345-A
Patent Document 20: JP Hei-5-197153-A
Patent Document 21: JP Hei-9-183846-A
Patent Document 22: JP 2001-183835-A
Patent Document 23: JP Hei-3-763-A
Patent Document 24: JP Hei-7-219228-A
Patent Document 25: JP Hei-10-186664-A
Patent Document 26: JP Hei-11-202489-A
Patent Document 27: JP 2001-56559-A
Patent Document 28: JP 2001-194791-A
Patent Document 29: JP 2002-526793-A
Patent Document 30: U.S. Pat. No. 6,143,467
Patent Document 31: JP 2001-125267-A Patent Document 32: JP Hei-3-58048-A
Patent Document 33: JP Hei-3-259148-A
Patent Document 34: JP Hei-10-195294-A
Patent Document 35: JP Hei-11-202488-A
Patent Document 36: JP 2000-250209-A
Patent Document 37: JP 2001-249454-A
Patent Document 38: JP 2004-94118-A
Nonpatent Document 1: J. Macromol. Sci. Chem., A24, 12, 1407, 1987
Nonpatent Document 2: Macromolecules, 23, 4796, 1990
Nonpatent Document 3: Macromolecules, 29, 6427, 1996

DISCLOSURE OF INVENTION

Problem to be Solved by the Invention

Aiming at overcoming the problems of the diazoquinone compound, there have been proposed a variety of chemical amplification systems. Examples thereof include chemical amplification type polyimide (see e.g., Patent Document 23) and chemical amplification type polyimide or polybenzoxazole precursors (e.g., see Patent Documents 24 to 30). Among such products, those having a high sensitivity have poor film property due to their low molecular weight, whereas those having good film property have poor sensitivity as a result of insufficient solubility due to their high molecular weight. Thus, these products can not be recognized as a material having a practical level of properties. There has also been proposed a product utilizing a negative chemical amplification system taking advantage of crosslinking reaction that proceeds in the presence of an acid catalyst (e.g., see Patent Documents 17 and 31). However, since the crosslinking point in their molecular chain is hydroxyl groups, actual crosslinking reaction efficiency of this product is too low to realize high sensitivity.

In addition, recently there have been proposed devices that are sensitive to a heating process at high temperature such as MRAM (magnetoresistive RAM). Therefore there is an increasing demand to lower the temperature for cyclizing the polyimide or polybenzoxazole precursor. Although there has been proposed a product containing a organic solvent-soluble polyimide that does not require cyclization process characterized in that the polyimide itself is photosensitized (e.g., see Patent Documents 32 to 38 and Nonpatent Document 3), that product has a drawback in either poor photosensitive property, poor development property in an alkaline aqueous solution or poor heat resistance. Therefore, none of the aforementioned products have sufficiently practical level of properties.

The present invention has been made for solving the aforementioned problems in prior art, and it is an object of the present invention to provide a positive photosensitive resin composition that gives a cured film having a high heat resistance, a good mechanical property, a good chemical resistance to strong alkaline aqueous solutions and organic solvents, and a good flux resistance.

It is another object of the present invention to provide a method for producing a pattern, which can be developed with an alkaline aqueous solution, and gives a pattern in a good shape with excellent heat resistance and mechanical property by the use of the aforementioned positive photosensitive resin composition. Further it is another object of the present invention to provide highly reliable electronic component by having a pattern with good shape and property.

Means for Solving Problem

That is, the positive photosensitive resin composition according to the present invention is characterized in that it comprises: (a) a polybenzoxazole or a polybenzoxazole precursor polymer having a structural unit represented by either a general formula (1) or (2) and satisfying following conditions (i) and/or (ii), (b) a compound that generates an acid by being irradiated with active light ray, and (c) a compound having a structure represented by a general formula (3) crosslinkable or polymerizable with the component (a) upon applying heat;

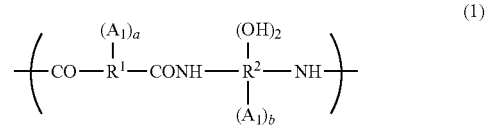

wherein $R^1$ represents a (2+a)-valent group containing an aromatic ring structure, an alicyclic structure having 4 to 20 carbon atoms, a siloxane structure or an alkylsilyl structure; $R^2$ represents (4+b)-valent group; $A_1$ is selected from $OR^3$, $SO_3R^3$, $CONR^3R^4$, $COOR^3$, and $SO_2NR^3R^4$, from which, when a plurality of $A_1$ are present, each $A_1$ is independently selected; $R^3$ and $R^4$ represent a hydrogen atom or a monovalent hydrocarbon group having 1 to 20 carbon atoms; and a and b each independently represent an integer of 0 to 4; wherein at least one of $R^1$ and $R^2$ represents a group containing the structure represented by the general formula (I) or (II) shown below, or a group containing an alicyclic structure having 4 to 20 carbon atoms;

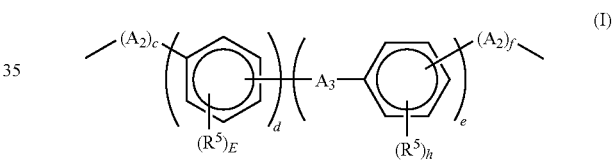

wherein c and f each independently represent an integer of 0 to 1; d and e each independently represent an integer of 0 to 6, and d+e>0; g and h each independently represent an integer of 0 to 4; $A_2$ and $A_3$ each independently represent a group containing the structure represented by $-(CR^6_2)_n-$, $-O-$, $-S-$, $-SO_2-$, $-CO-$, $-NHCO-$, $-C(CF_3)_2-$, $-C(R^6)_2-$, $-Si(R^6)_2-$, $-OSi(R^6)_2-$, $-Si(R^6)_2O-$, $-OSi(R^6)_2O-$, $-Si(R^6)_2O-Si(R^6)_2-$ or $-R^7C=CR^8-$, and n represents an integer of 1 to 20; a plurality of $R^5$ each independently represent a hydrogen atom, a hydroxyl group or a monovalent hydrocarbon group having 1 to 20 carbon atoms; and $R^6$, $R^7$ and $R^8$ each independently represent a hydrogen atom or a monovalent hydrocarbon group having 1 to 20 carbon atoms;

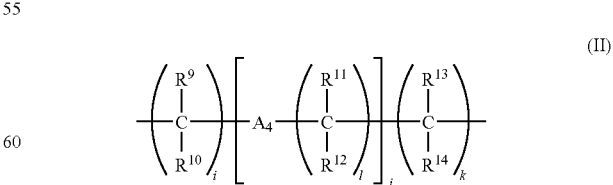

wherein $R^9$ to $R^{14}$ each independently represent hydrogen, fluorine or an alkyl group having 1 to 6 carbon atoms; i, j and k each independently represent an integer of 0 to 6; l represents an integer of 0 to 3 with a proviso that i+k>0; $A_4$ represents a group containing the structure represented by —O—, —S—, —SO$_2$—, —CO—, —NHCO—, —C(CF$_3$)$_2$—, —C(R$^6$)$_2$—, —Si(R$^6$)$_2$—, —OSi(R$^6$)$_2$—, —Si(R$^6$)$_2$O—, —OSi(R$^6$)$_2$O—, —Si(R$^6$)$_2$O—Si(R$^6$)$_2$—, —C≡C— or —R$^{15}$C=CR$^{16}$—; R$^6$ each independently represent a hydrogen atom or a monovalent hydrocarbon group having 1 to 20 carbon atoms; and R$^{15}$ to R$^{16}$ each independently represent hydrogen, fluorine or an alkyl group having 1 to 6 carbon atoms;

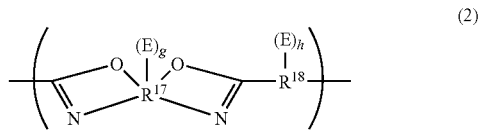

(2)

wherein R$^{17}$ represents a (4+g)-valent group; R$^{18}$ represents a (2+h)-valent group containing an aromatic ring structure, an alicyclic structure having 4 to 20 carbon atoms, a siloxane structure or an alkylsilyl structure; at least one of R$^{17}$ and R$^{18}$ has the structure represented by the general formula (I) or (II) or an alicyclic structure having 4 to 20 carbon atoms; a plurality of E may be the same or different, and are selected from OR$^{19}$, SO$_3$R$^{19}$, CONR$^{19}$R$^{20}$, COOR$^{20}$ and SO$_2$NR$^{19}$R$^{20}$; R$^{19}$ and R$^{20}$ represent a hydrogen atom or a monovalent hydrocarbon group having 1 to 10 carbon atoms; and g and h represents an integer of 0 to 4 with a proviso that g+h>0;

Condition (i): as a terminal group, the component (a) has a functional group reactable with the component (c) upon being thermally cured, and Condition (ii): when the component (a) includes the structure represented by the general formula (I), if c+f=0 in the general formula (I), d+e≧3;

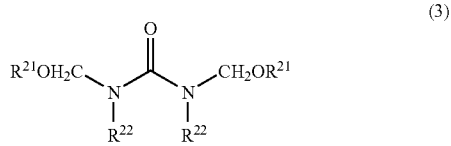

(3)

wherein a plurality of R$^{21}$ each independently represent a hydrogen atom or a monovalent organic group; and a plurality of R$^{22}$ each independently represent a hydrogen atom or a monovalent organic group, and they may be bound one another to form a ring structure.

In the positive photosensitive resin composition according to the present invention, it is preferable that the component (a) has, as the terminal group, the functional group reactable with the component (c) upon being thermally cured.

In the positive photosensitive resin composition according to the present invention, content of the component (c) is preferably 20 parts by weight or more based on 100 parts by weight of the component (a).

In the positive photosensitive resin composition according to the present invention, the component (b) is preferably an o-quinonediazide compound.

The method for producing the pattern according to the present invention is characterized by comprising a step of applying and drying the positive photosensitive resin composition on a support substrate to form a photosensitive resin film, a step of exposing to light the photosensitive resin film obtained by the step of applying and drying, a step of developing using an alkaline aqueous solution for removing a light-exposed portion of the photosensitive resin film after the exposure, and a step of thermally treating the photosensitive resin film after the development.

The electronic component according to the present invention is an electronic component having an electric device having a layer of a pattern obtained by the method for producing the pattern, and is characterized in that the layer of the pattern is provided as an interlayer insulation film layer, a rewiring layer or a surface protection film layer in the electronic device.

Effect of the Invention

The film obtained by pattern formation and heat curing with the positive photosensitive resin composition of the present invention has excellent heat resistance and mechanical property. Since the positive photosensitive resin composition of the present invention has the structural unit represented by either the general formula (1) or (2), and also has the compound represented by the general formula (3) as the component (c) that is crosslinkable with the polybenzoxazole or the polybenzoxazole precursor polymer, stability of the film after development is improved and therefore the restriction of process is reduced. Further, resistance against strong alkali is also improved. Further, by using the composition containing the component (c) at 20 parts by weight or more based on 100 parts by weight of the component (a), the resulting cured film acquires excellent resistance against the organic solvent and the flux. Even when the thermal treatment is performed at low temperature of 220° C. or below, the properties of the resulting cured film are the same as those treated at higher temperature.

According to the method for producing the pattern of the present invention, by the use of the positive photosensitive resin composition, a pattern that has excellent heat resistance and good shape is obtained.

Further, the electronic component of the present invention having the pattern with the good shape and property can achieve high reliability.

EXPLANATIONS OF LETTERS OR NUMERALS

Figure 1:
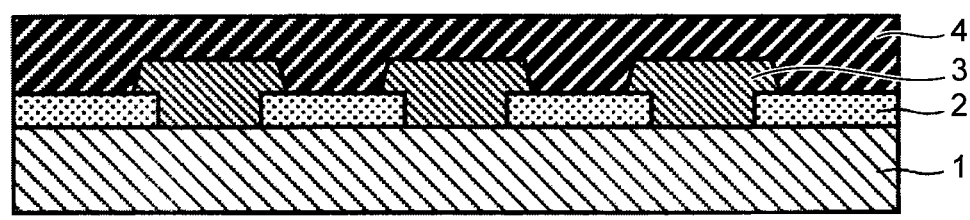
FIG. 1 is a schematic cross sectional view illustrating a step of producing a semiconductor device having a multilayer wiring structure in an embodiment of the present invention.

1 SEMICONDUCTOR SUBSTRATE
2 PROTECTION FILM
3 FIRST CONDUCTOR LAYER
4 INTERLAYER INSULATION FILM LAYER
5 PHOTOSENSITIVE RESIN LAYER
6A, 6B, 6C, 6D WINDOW

7 SECOND CONDUCTOR LAYER
8 SURFACE PROTECTION LAYER

BEST MODES FOR CARRYING OUT THE INVENTION

Embodiments of the positive photosensitive resin composition, the method for producing a pattern and the electronic component according to the present invention will be explained in detail hereinbelow with referring to drawings. The present invention is not limited by these embodiments.

[Positive Photosensitive Resin Composition]

The positive photosensitive resin composition according to the present invention contains polybenzoxazole or a polybenzoxazole precursor polymer having a structural unit represented by either the general formula (1) or (2) and satisfying the following conditions (i) and/or (ii) (hereinafter referred to as a "component (a)"), (b) a compound that generates an acid by being irradiated with active light ray (hereinafter referred to as a "component (b)") and (c) a compound having a structure represented by a general formula (3) crosslinkable or polymerizable with the component (a) upon applying heat (hereinafter referred to as a "component (c)"). Each component will be described hereinbelow.

[Component (a)]

The component (a) used in the present invention is not particularly limited as long as the component is polybenzoxazole or the polybenzoxazole precursor polymer having a structural unit represented by either the general formula (1) or (2) and satisfying the following conditions (i) and/or (ii).

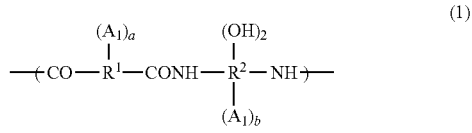
(1)

In the formula, $R^1$ represents a (2+a)-valent group containing an aromatic ring structure, an alicyclic structure having 4 to 20 carbon atoms, a siloxane structure or an alkylsilyl structure, and $R^2$ represents (4+b)-valent group. $A_1$ is selected from $OR^3$, $SO_3R^3$, $CONR^3R^4$, $COOR^S$, and $SO_2NR^3R^4$. When a plurality of $A_1$ are present, each $A_1$ is independently selected from this group. $R^3$ and $R^4$ represent a hydrogen atom or a monovalent hydrocarbon group having 1 to 20 carbon atoms. a and b each independently represent an integer of 0 to 4. At least one of $R^1$ and $R^2$ represents a group containing a structure represented by the general formula (I) or (II) shown below, or a group containing an alicyclic structure having 4 to 20 carbon atoms.

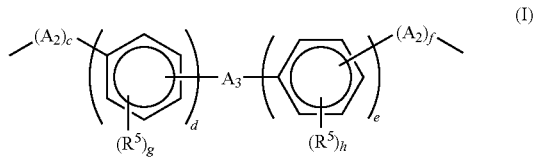
(I)

In the formula, c and f each independently represent an integer of 0 to 1. d and e each independently represent an integer of 0 to 6, and d+e>0. g and h each independently represent an integer of 0 to 4. $A_2$ and $A_3$ each independently represent a group containing a structure represented by —$(CR^6_2)_n$—, —O—, —S—, —$SO_2$—, —CO—, —NHCO—, —$C(CF_3)_2$—, —$C(R^6)_2$—, —$Si(R^6)_2$—, —$OSi(R^6)_2$—, —$Si(R^6)_2O$—, —$OSi(R^6)_2O$—, —$Si(R^6)_2O$—$Si(R^6)_2$— or —$R^7C$=$CR^8$—. n represents an integer of 1 to 20. A plurality of $R^5$ each independently represent a hydrogen atom, a hydroxyl group or a monovalent hydrocarbon group having 1 to 20 carbon atoms. $R^6$, $R^7$ and $R^8$ each independently represent a hydrogen atom or a monovalent hydrocarbon group having 1 to 20 carbon atoms.

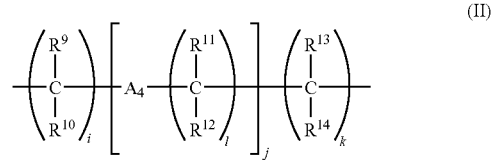
(II)

In the formula, $R^9$ to $R^{14}$ each independently represent hydrogen, fluorine or an alkyl group having 1 to 6 carbon atoms. i, j and k each independently represent an integer of 0 to 6, and l represents an integer of 0 to 3, with a proviso that i+k>0. $A_4$ represents a group containing a structure represented by —O—, —S—, —$SO_2$—, —CO—, —NHCO—, —$C(CF_3)_2$—, —$C(R^6)_2$—, —$Si(R^6)_2$—, —$OSi(R^6)_2$—, —$Si(R^6)_2O$—, —$OSi(R^6)_2O$—, —$Si(R^6)_2O$—$Si(R^6)_2$—, —C≡C— or —$R^{15}C$=$CR^{16}$—. $R^6$ each independently represent a hydrogen atom or a monovalent hydrocarbon group having 1 to 20 carbon atoms. $R^{15}$ to $R^{16}$ each independently represent hydrogen, fluorine or an alkyl group having 1 to 6 carbon atoms.

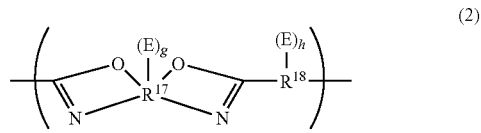
(2)

In the formula, $R^{17}$ represents a (4+g)-valent group, and $R^{18}$ represents a (2+h)-valent group containing an aromatic ring structure, an alicyclic structure having 4 to 20 carbon atoms, a siloxane structure or an alkylsilyl structure. At least one of $R^{17}$ and $R^{19}$ has a structure represented by the aforementioned general formula (I) or (II) or an alicyclic structure having 4 to 20 carbon atoms. A plurality of E may be the same or different, and selected from $OR^{19}$, $SO_3R^{19}$, $CONR^{19}R^{20}$, $COOR^{20}$ and $SO_2NR^{19}R^{20}$. $R^{19}$ and $R^{20}$ represent a hydrogen atom or a monovalent hydrocarbon group having 1 to 10 carbon atoms. g and h represents an integer of 0 to 4, with a proviso that g+h>0.

The aforementioned component (a) preferably satisfies the following condition (i) and/or condition (ii), and more preferably satisfies both the condition (i) and the condition (ii).

Condition (i): The component has, as a terminal group, a functional group reactable with the component (c) upon being thermally cured.

Condition (ii): When the component (a) includes the structure represented by the general formula (I), if c+f=0 in the general formula (I), d+e≧3.

These conditions will be described hereinbelow. In order to express effects of the present invention, it is necessary to efficiently cause cyclization reaction, if the polybenzoxazole precursor is used as the component (a). It is also necessary to rapidly cause a prompt reaction with a crosslinking agent in both cases wherein either the polybenzoxazole precursor or polybenzoxazole is used as the component (a). Therefore, for efficient cyclization reaction, it is preferable to have a high flexibility of a resin skeleton. Specifically, it is preferable to have a structure such as those represented by the aforementioned general formula (I) or (II) and the alicyclic structure in the polymer skeleton. For efficient crosslinking reaction, it is also preferable to have a reaction point for the reaction with the crosslinking agent in the terminal group. Satisfying both of them (i.e., condition (i)), sufficient effects are obtained in the present invention.

However, in the case of not having the reaction point for the reaction with the crosslinking agent in the terminal group, it is likely that the effect is insufficient with the structure represented by the general formula (I). This can be compensated by further facilitating the cyclization and performing the crosslinking reaction efficiently in the polymer chain. To this end, it is preferable to increase flexibility of the resin skeleton. Specifically, sufficient flexibility for expressing the effect of the present invention can be imparted by employing $c+f>0$ or $d+e \geq 3$ in the case of the general formula (I) (i.e., condition (ii)). In order to express the effect of the present invention, it is more preferable to satisfy both conditions (i) and (ii) simultaneously.

The polymer having the structural unit represented by the general formula (1) is generally soluble in the organic solvent, and thus causes no problem. However, when the polymer is the one having the structural unit represented by the general formula (2), some of them are insoluble in the organic solvent, and therefore it is preferable that the polymer is soluble in the organic solvent in terms of workability upon forming the film. Examples of the organic solvent referred to herein may include N-methyl-2-pyrrolidone, γ-butyrolactone, N,N-dimethylacetamide, dimethylsulfoxide, 2-methoxyethanol, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol acetate, cyclohexanone, cyclopentanone and tetrahydrofuran. One species thereof may be used alone, or mixtures thereof may also be used.

A possible standard for determining whether the component (a) of the present invention is soluble in the organic solvent is as follows: when the component (a) is placed in one of the solvents exemplified above at a weight ratio of (the component (a)):(the solvent)=50:50 to 20:80 and mixed at 20 to 25° C. by stirring using a mix rotor, the component (a) is completely dissolved.

Polybenzoxazole and the precursor thereof that can be used as the component (a) will be further described.

Polybenzoxazole precursors (generally polyhydroxyamide) whose ring can be closed to form polybenzoxazole upon application of heat are materials having excellent heat resistance, mechanical property and electric property, and currently polybenzoxazole precursors are frequently used for the electronic component. The present invention is to exhibit excellent properties such as heat resistance, mechanical property, electric property and resistance to the strong alkali, as a result of the selection of the polybenzoxazole precursor of a particular structure having the structural unit represented by the general formula (1) as the polybenzoxazole precursor, and co-use of another component such as the compound represented by the general formula (3).

In the general formula (1), $A_1$ is selected from $OR^3$, $SO_3R^3$, $CONR^3R^4$, $COOR^3$ and $SO_2NR^3R^4$ (wherein $R^3$ and $R^4$ represent a hydrogen atom or a monovalent hydrocarbon group having 1 to 20 carbon atoms). These are generally for giving the polybenzoxazole precursor solubility in an appropriate alkaline aqueous solution. Since the polybenzoxazole precursor has two OH groups as shown in the general formula (1), when $A_1$ is absent, the structure of polyhydroxyamide is most commonly used.

The polyhydroxyamide has a repeating unit represented by the following general formula (4). The amide unit having hydroxy groups is subjected to dehydration-ring closure reaction upon being cured at the final stage, to be converted to an oxazole body having excellent heat resistance, mechanical property and electric property.

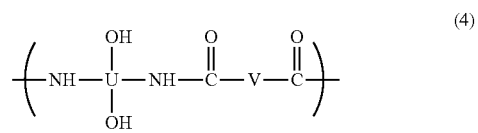

(4)

In the formula, U represents a tetravalent organic group and U represents a bivalent organic group.

The polybenzoxazole precursor in the present invention is necessary to have the structural unit represented by the aforementioned general formula (1) for achieving the excellent effects of the present invention. Thus, the aforementioned V must include the aromatic ring structure, alicyclic structure having 4 to 20 carbon atoms, siloxane structure or alkylsilyl structure in the same manner as in $R^1$ in the general formula (1). In addition, it is necessary to have the structure represented by the aforementioned general formula (I) or (II) or the alicyclic structure having 4 to 20 carbon atoms.

The polybenzoxazole precursor used in the present invention having the structural unit represented by the general formula (1) may have, together with this structural unit, another structural unit, e.g., the structural unit having no hydroxyl group. However, the structural unit represented by the general formula (1) and containing the hydroxy group is preferably contained at a certain ratio or more, in order to secure solubility in the alkaline aqueous solution and capability to form a benzoxazole ring having excellent heat resistance by the heat cyclization to be performed later. An example, which contains such a preferable amount of the repeating unit represented by the aforementioned general formula (4), will be explained.

That is, a preferable polyhydroxyamide is represented by the following general formula (5):

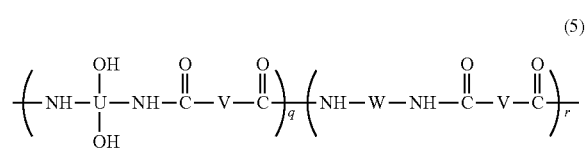

(5)

In the formula, U represents a tetravalent organic group, and V and W represent a bivalent organic group. q and r represent a mole fraction, and the sum of q and r is 100 mol %. q is 60 to 100 mol % and r is 40 to 0 mol %. The mole fraction of q and r in the general formula (5) is more preferably q=80 to 100 mol % and r=20 to 0 mol %.

In general, the polybenzoxazole precursor in the present invention may be synthesized from a dicarboxylic acid derivative and hydroxy group-containing diamines. Specifically, the polybenzoxazole precursor may be synthesized by converting a dicarboxylic acid derivative to a dihalide derivative and then performing the reaction with the diamines. As the dihalide derivative, a dichloride derivative is preferable.

The dichloride derivative may be synthesized by a reaction of the dicarboxylic acid derivative with a halogenating agent. Examples of the halogenating agent for use may include thionyl chloride, phosphoryl chloride, phosphorous oxychloride and phosphorous pentachloride, which are used for an ordinary acid chlorination reaction of carboxylic acids.

Examples of the method for synthesizing the dichloride derivative may include reaction of the dicarboxylic acid derivative with the halogenating agent in a solvent, and reaction in the halogenating agent in excess, followed by distilling off excessive components. As the reaction solvents, N-methyl-2-pyrrolidone, N-methyl-2-pyridone, N,N-dimethylacetamide, N,N-dimethylformamide, toluene and benzene may be used.

When the reaction is performed in the solvent, the amount of the halogenating agent to be used relative to the amount of the dicarboxylic acid derivative is preferably 1.5 to 3.0 mol, more preferably 1.7 to 2.5 mol. When the reaction is performed in the halogenating agent, the amount is preferably 4.0 to 50 mol and more preferably 5.0 to 20 mol. The reaction temperature is preferably −10 to 70° C. and more preferably 0 to 20° C.

Preferably, the reaction of the dichloride derivative and the diamines is performed in an organic solvent in the presence of a dehydrohalogenation agent. As the dehydrohalogenation agent, an organic base such as pyridine or triethylamine is usually used. As the organic solvent, N-methyl-2-pyrrolidone, N-methyl-2-pyridone, N,N-dimethylacetamide and N,N-dimethylformamide may be used. The reaction temperature is preferably −10 to 30° C. and more preferably 0 to 20° C.

The tetravalent organic group represented by U in the general formula (4) may generally be a residue of a diamine represented by the general formulae (6) shown below which reacts with dicarboxylic acid to form a polyamide structure, and which has a structure in which each of two hydroxy groups is positioned at ortho position of an amine.

(6)

In the formulae, s and t each independently represent an integer of 1 to 6. A plurality of g and h each independently represent an integer of 0 to 4. A plurality of $A_3$ each independently represent a group containing a structure represented by —$(CR^{24}_2)_n$—, —O—, —$SO_2$—, —CO—, —NHCO—, —$C(CF_3)_2$—, —$C(R^{24})_2$—, —$Si(R^{24})^2$—, —$OSi(R^{24})_2$—, —$Si(R^{24})_2O$—, $OSi(R^{24})_2O$—, —$Si(R^{24})_2O$—$Si(R^{24})_2$— or —$R^{25}C$=$CR^{26}$—. $A_4$ represents a group containing a structure represented by —O—, —O—, —$SO_2$—, —CO—, —NHCO—, —$C(CF_3)_2$—, —$C(R^{24})_2$—, —$Si(R^{24})_2$—, —$OSi(R^{24})_2$—, $Si(R^{24})_2O$—, —$OSi(R^{24})_2O$—, —$Si(R^{24})_2$O—$Si(R^{24})_2$—, —C≡C— or —$R^{15}C$=$CR^{16}$—. n represents an integer of 1 to 20. A plurality of $R^{23}$ each independently represent a hydrogen atom, a hydroxyl group or a monovalent hydrocarbon group having 1 to 20 carbon atoms. $R^{24}$, $R^{25}$ and $R^{26}$ each independently represent a hydrogen atom or a monovalent hydrocarbon group having 1 to 20 carbon atoms. Z represents an organic group having an alicyclic structure having 4 to 20 carbon atoms.

Examples of such diamines may include compounds represented by the following general formulae (7).

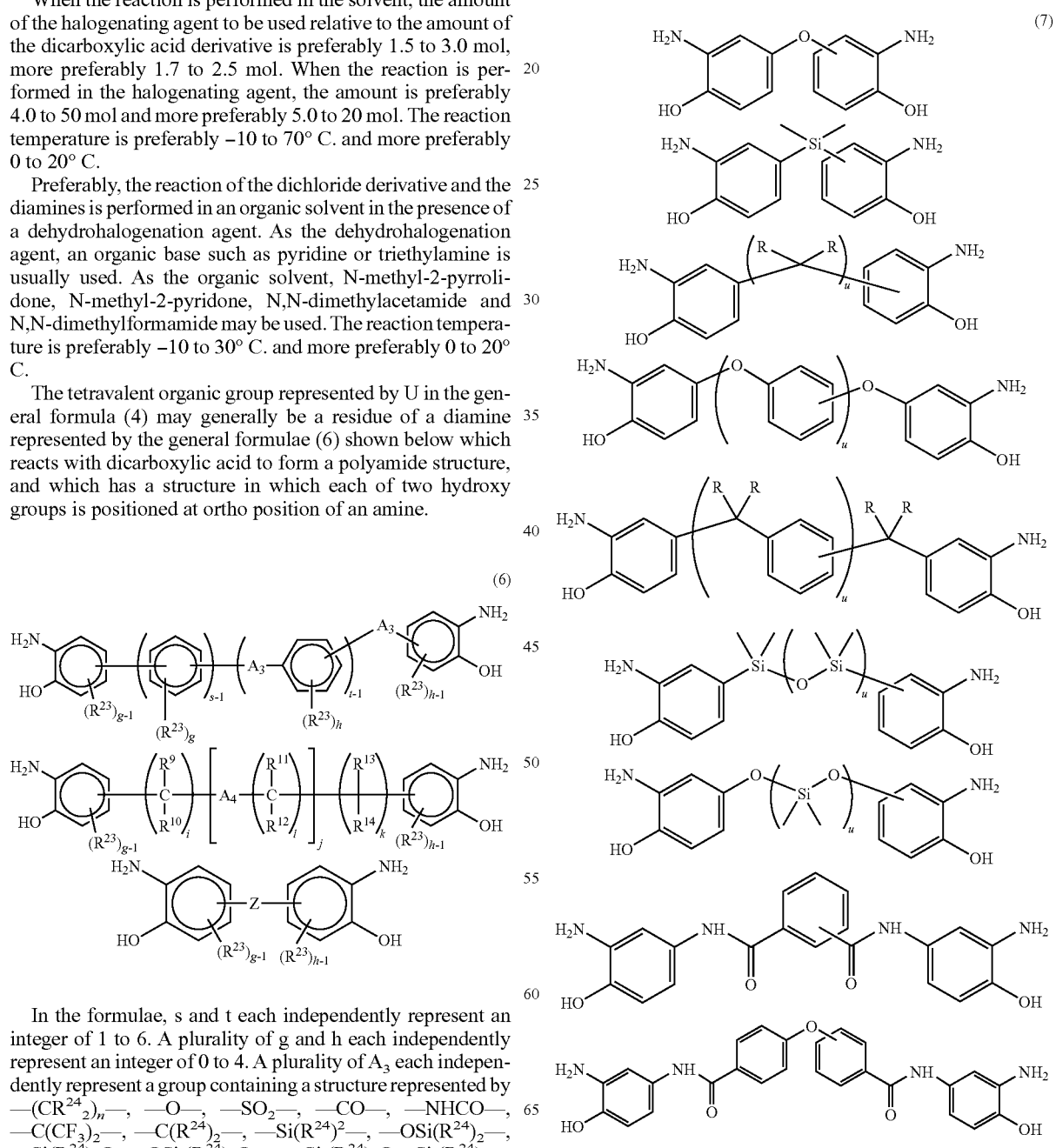

(7)

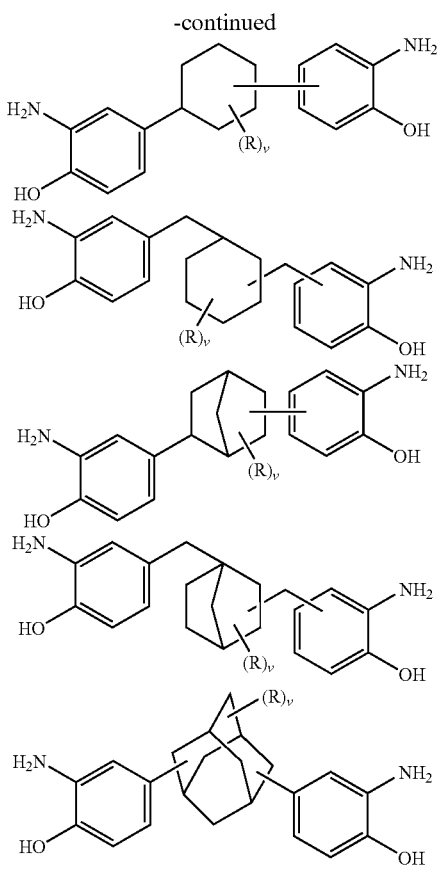

The examples may also include the isomers of the aforementioned general formulae (7), wherein substituted positions of the amino group and the hydroxyl group bound to the benzene ring are swapped. R represents a hydrogen atom, or an alkyl group or a fluoro-substituted alkyl group having 1 to 10 carbon atoms. u represents an integer of 1 to 20, and v represents an integer of 0 or more and up to the upper limit number for substituting all of the hydrogen atoms of each alicyclic structure. However, the diamines are not limited to these compounds One species of these compounds may be used alone, or two or more thereof may be used in combination.

In the general formula (5) that represents the polyhydroxyamide, the bivalent organic group represented by W may generally be a residue of diamine that reacts with dicarboxylic acid to form the polyamide structure, with a proviso that the residue is other than the diamine that forms U. Preferably U is a bivalent aromatic group or aliphatic group, the number of whose carbon atoms is preferably 4 to 40. More preferably, U is a bivalent aromatic group having 4 to 40 carbon atoms.

Examples of such diamines may include, but are not limited to, aromatic diamine compounds such as 4,4'-diaminodiphenyl ether, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether and 1,4-bis(4-aminophenoxy)benzene, as well as diamines having a silicone group such as LP-7100, X-22-161AS, X-22-161A, X-22-161B, X-22-161C and X-22-161E (trade names, supplied from Shin-Etsu Chemical Co., Ltd.).

One species of these compounds may be used alone, or two or more thereof may be used in combination.

In the general formula (4), the bivalent organic group represented by V is a residue of dicarboxylic acid, which reacts with the diamine to form the polyamide structure, and which is represented the general formulae (8) as described below.

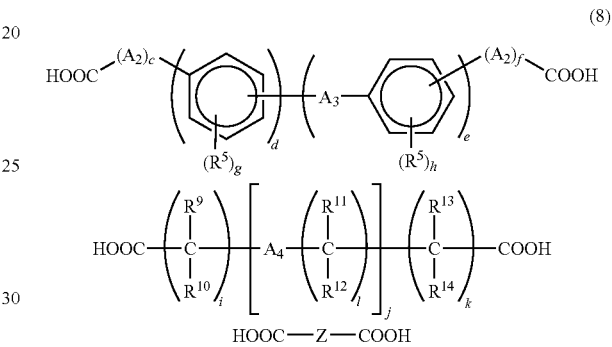

(8)

In the formulae, c and f each independently represent an integer of 0 to 1. d and e each independently represent an integer of 0 to 6 and d+e>0. g and h each independently represent an integer of 0 to 4. $A_2$ and $A_3$ each independently represent a group containing a structure represented by —$(CR^6_2)_n$—, —O—, —S—, —$SO_2$—, —CO—, —NHCO—, —$C(CF_3)_2$—, —$C(R^6)_2$—, —$Si(R^6)_2$—, —$OSi(R^6)_2$—, —$Si(R^6)_2O$—, —$OSi(R^6)_2O$—, —$Si(R^6)_2$O—$Si(R^6)_2$— or —$R^7C$=$CR^8$—. $A_4$ represents a group containing a structure represented by —O—, —S—, —$SO_2$—, —CO—, —NHCO—, —$C(CF_3)_2$—, —$O(R^6)_2$—, —Si$(R^6)_2$—, —$OSi(R^6)_2$—, —$Si(R^6)_2O$—, —$OSi(R^6)_2O$—, —$Si(R^6)_2O$—$Si(R^6)_2$—, —C≡C— or —$R^{15}C$=$CR^{16}$—. n represents an integer of 1 to 20. A plurality of $R^5$ each independently represent a hydrogen atom, a hydroxyl group or a monovalent hydrocarbon group having 1 to 20 carbon atoms. $R^6$, $R^7$ and $R^8$ each independently represent a hydrogen atom or a monovalent hydrocarbon group having 1 to 20 carbon atoms. Z represents an organic group having an alicyclic structure having 4 to 20 carbon atoms.

Examples of the dicarboxylic acid may include compounds represented by the following general formulae (9) and general formulae (10).

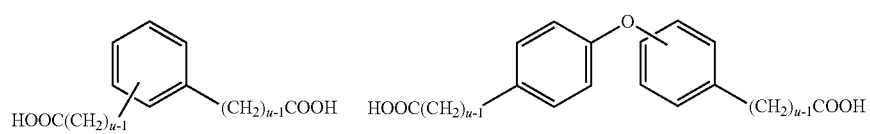

(9)

-continued
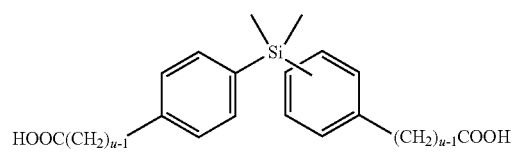
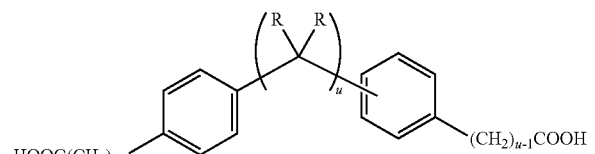
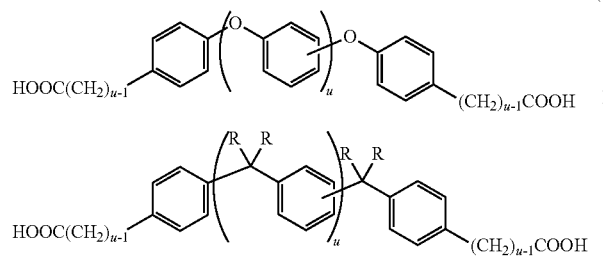
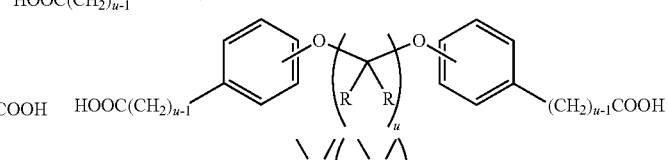
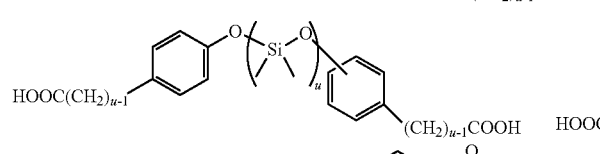
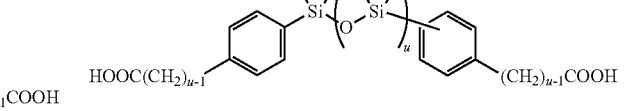
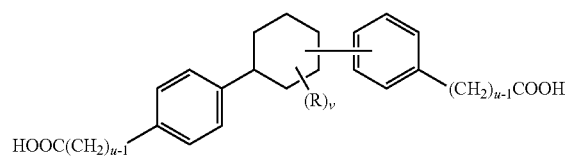
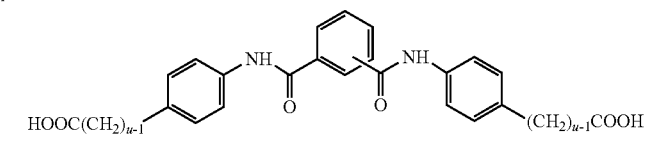
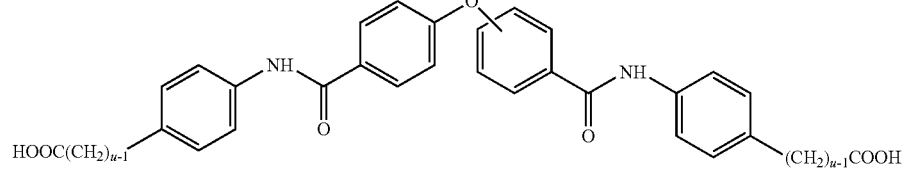
(10)
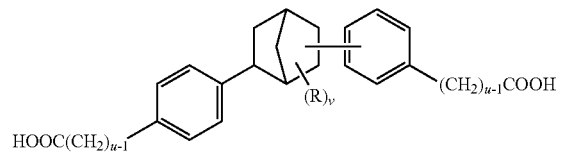
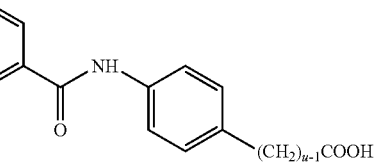
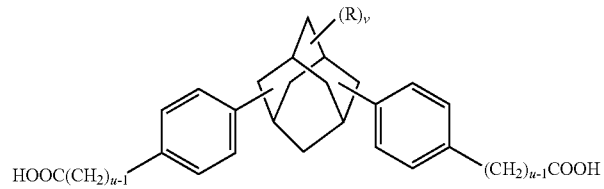
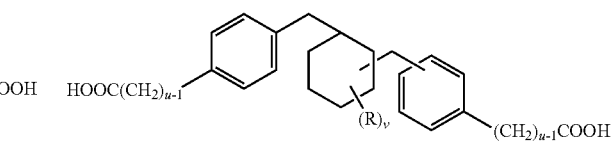
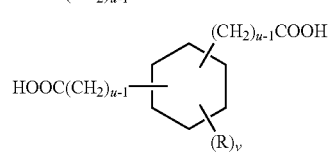
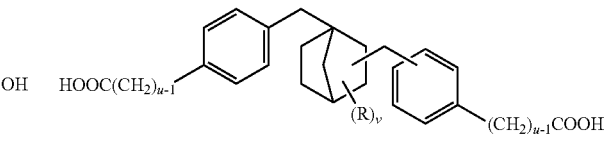
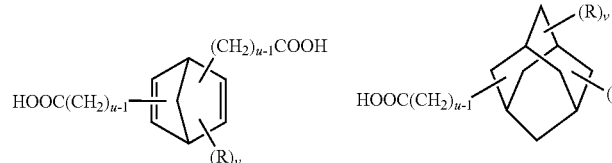
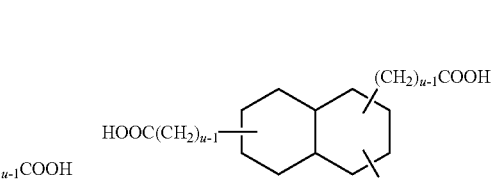
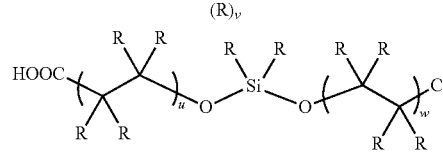
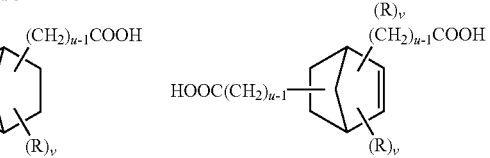
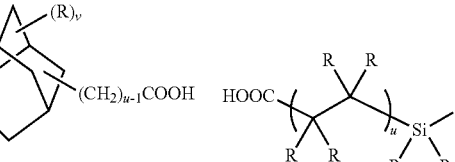
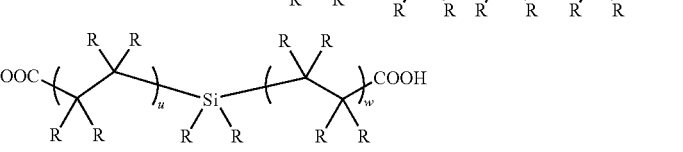

In the aforementioned general formulae (9) and general formulae (10), R represents a hydrogen atom, or an alkyl group or a fluoro-substituted alkyl group having 1 to 10 carbon atoms. u represents an integer of 1 to 20, and v represents an integer of 0 or more and up to the upper limit number for substituting all of the hydrogen atoms of each alicyclic structure, but they are not limited thereto. w represents an integer of 1 to 20. One species of these compounds may be used alone, or two or more thereof may be used in combination.

Polybenzoxazole in the present invention has the structural unit represented by the general formula (2). This may be prepared, for example, by dehydration-ring closure reaction of the polybenzoxazole precursor having the structural unit represented by the general formula (1). When polybenzoxazole is used as the component of the positive photosensitive resin composition of the present invention, the polybenzoxazole molecule must have at least one group represented by E in the general formula (2) because polybenzoxazole must have solubility in an alkaline aqueous solution. In addition, as have already discussed, it is preferable that the polybenzoxazole is soluble also in an organic solvent, for achieving uniform dissolution in the positive photosensitive resin composition.

Other particular requirements concerning the structure of polybenzoxazole are the same as in the explanation regarding the aforementioned polybenzoxazole precursor.

The molecular weight of the component (a) is preferably 3,000 to 200,000 and more preferably 5,000 to 100,000 in terms of a weight average molecular weight. The molecular weight is a value measured by a gel permeation chromatography method, and converting the measured value with a standard polystyrene calibration curve.

As to the crosslinking reaction of the component (a) and the component (c) in the present invention, the crosslinked point is not necessarily limited to the terminus alone, and a functional group in the main chain of the component (a) may be involved in the crosslinking reaction with the component (c). In particular, since the compound having the crosslinked point at the terminus is advantageous for enhancing the mechanical property of the cured film, it is preferable to have the substituent crosslinkable with the component (c) in the terminal group.

The combination of the terminal group in the component (a) and the functional group in the component (c) therefor is not particularly limited as long as they can form the bond therebetween by heat in any form of a covalent bond, an ionic bond and a hydrogen bond.

For constituting the combination, it is preferable to select one functional group from the following groups A and B for each of the component (a) and component (c) in terms of reactivity, i.e., mechanical property of the finally resulting film. In this case, the component (a) may be selected from either one of two groups, although it is necessary to constitute the combination by selecting the functional groups of component (a) and the component (c) from the mutually different group.

Group A: primary or secondary alcohol, phenol, carboxyl group, amino group, alkylamino group, thiol, and aromatic ring.

Group B: methylol, alkoxyalkyl group, tertiary alcohol, cycloalkyl group, olefin, triple bond, halogenated alkyl, cyclic ether such as epoxy group, ester bond, carbonate, and isocyanate.

In addition to the aforementioned combinations, other examples of the preferable, highly reactive combinations may include a combination of carboxyl group or ester and amino group, a combination of carboxyl group or ester and primary or secondary alcohol or phenol, a combination of cycloalkyl groups, a combination of carboxyl groups, a combination of alcohols, a combination of epoxy groups, a combination of olefins or triple bonds, and a combination of methylols.

When the resin exemplified in the above as those having the preferable main chain skeleton is used, it is desirable in terms of easy introduction of the terminal group that the terminus of the component (a) is carboxyl group or an ester derived therefrom, or amino group or an isocyanate precursor derived therefrom. From such a viewpoint, examples of particularly preferable combinations may include a combination of carboxyl group or ester as the component (a) and primary or secondary alcohol, epoxy group, vinyl ether or isocyanate as the component (c), a combination of amino group as the component (a) and epoxy group or ester as the component (c), and a combination of isocyanate as the component (a) and primary or secondary alcohol, phenol, carboxyl group or ester as the component (c). In addition, other examples of the combinations, which are particularly preferable in terms of good strength of the cured film, may include a combination of olefins or triple bonds, and a combination of an aromatic ring or phenol as the component (a) and a methylol group, an alkoxyalkyl group, a tertiary alcohol or vinyl ether as the component (c).

Compounds that are preferable for introducing the aforementioned functional groups into the component (a) (the compounds constituting the terminal groups) are exemplified below.

For esterification, alcohols having 1 to 20 carbon atoms and phenols having 6 to 30 carbon atoms may be preferably used.

It is preferable for easy synthesis that the isocyanate precursor is prepared by reacting alkoxycarbonyl halide having 1 to 20 carbon atoms or phenoxycarbonyl halide having 6 to 30 carbon atoms with the amino group of an amine residue.

Further, introduction of the olefin or the triple bond may be performed with an acid halide or acid anhydride having a partial structure represented by the following general formulae (11).

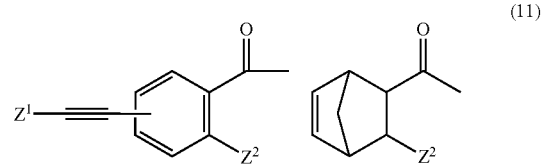

(11)

In the formulae, $Z^1$ represents a hydrogen atom or an alkyl group having 1 to 20 carbon atoms or a monovalent organic group having an aromatic ring structure having 6 to 30 carbon atoms, and $Z^2$ represents a substituent derived from a carboxyl group that together with an adjacent carbonyl group forms an acid anhydride structure, or a hydrogen atom.

The aromatic ring or phenol may be introduced by using an aniline derivative or a benzoic acid derivative having 6 to 30 carbon atoms, or a phenol derivative or an alkoxy-substituted benzene derivative having a structure represented by any of the following general formulae (12).

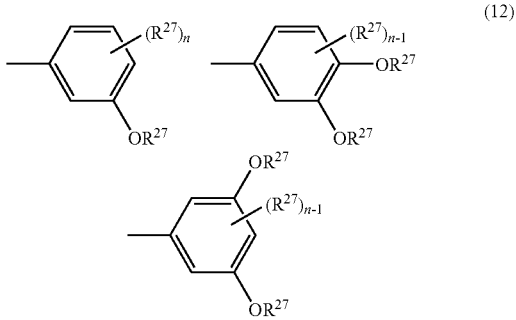

(12)

In the formulae, $R^{27}$ each independently represent a monovalent organic group, and n represents an integer of 1 to 4.

The aforementioned terminal group may be introduced into the main chain skeleton by using corresponding aminophenol or a hydroxybenzoic acid derivative.

The combination of the terminal group of the component (a) and the functional group of the component (c) is selected so that no bond (crosslinking) is basically produced when the photosensitive resin composition is applied. That is, the temperature at which the crosslinking occurs in that combination in the presence of an acid is preferably 150° C. or higher. In order to have such a property, the functional group enumerated in the examples of the combinations may be modified to be in a latent form such as a protected form or a derivative, which may be converted to be the desired functional group by chemical change with heat upon light chemical reaction by light-exposure or subsequent heating step after the light-exposure. For example, since an isocyanate reacts at a low temperature of 150° C. or below, its amino group may be blocked with an alkoxycarbonyl group to have its precursor, which then may be introduced into the terminal group of the component (a) or the component (c).

In the component (a) used in the present invention, the amount of the terminal groups crosslinkable with the component (c) is preferably 1 to 6 and more preferably 2 to 4 as a total of those in both termini. As to the ratio of these terminal groups with respect to the repeating units, the molar ratio the repeating units (the repeating units composed of the acid residue and the amine residue) are preferably 1 to 100 and more preferably 2 to 50 based on 2 of the terminal groups. When the terminal group ratio is smaller than this, the mechanical property or the chemical liquid resistance or the flux resistance of the cured film may possibly be reduced. When the ratio is larger than this, the molecular weight may become too small and thereby the physical property of the film may become insufficient even when the crosslinking reaction proceeds sufficiently. The molar ratio of the acid residue with respect to the amine residue is not particularly limited. However, the number of the acid residue is one more than the number of the amine residue and the ratio is in the range of preferably 100:99 to 2:1 and more preferably 50:49 to 3:2 when the terminal group is derived from aminophenol. Meanwhile, the number of the acid residue is one less than the number of the amine residue and the ratio is in the range of preferably 99:100 to 1:2 and more preferably 49:50 to 2:3 when the terminal group is derived from the acid derivative. Quantification for these groups may be performed by measurement with $^1$H-NMR.

[Component (b)]

The positive photosensitive resin composition of the present invention contains as the component (b) a compound that generates an acid by being irradiated with the active light ray (hereinafter referred to as an acid generator) together with the polymer as the component (a). The content of this acid generator is preferably 0.01 to 50 parts by weight, more preferably 0.01 to 20 parts by weight and still more preferably 0.5 to 20 parts by weight based on 100 parts by weight of the component (a) in order to have good sensitivity and resolution upon photosensitization.

The compound that generates an acid by the light as the component (b) in the present invention is a photosensitizing agent and has a function of generating an acid and increasing the solubility of the portion irradiated with the light in the alkaline aqueous solution. However, it is preferable that the acid generated by the component (b) is not the one that does not cause binding (crosslinking) between the terminal group of the component (a) and the functional group of the component (c). Examples of the component (b) may include without any particular limitation o-quinonediazide compounds, aryldiazonium salts, diaryliodonium salts and triarylsulfonium salts. Particularly preferable is the o-quinonediazide compounds because of its high sensitivity and absence of the nature of causing bond (crosslinking) between the terminal group of the component (a) and the functional group of the component (c).

The o-quinonediazide compound may be obtained, for example, by a condensation reaction of an o-quinonediazidesulfonyl chloride with a hydroxy compound or an amino compound in the presence of a dihydrochloric acid agent. Examples of the o-quinonediazidesulfonyl chlorides for use may include benzoquinone-1,2-diazide-4-sulfonyl chloride, naphthoquinone-1,2-diazide-5-sulfonyl chloride and naphthoquinone-1,2-diazide-4-sulfonyl chloride.

Examples of the hydroxy compound for use may include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and tris(4-hydroxyphenyl)ethane.

Examples of the amino compounds for use may include p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane.

Ratio of o-Quinonediazidesulfonyl chloride with respect to the hydroxy compound and/or the amino compound are preferably adjusted so that a total sum of the hydroxyl group and the amino group is 0.5 to 1 equivalent based on 1 mol of o-quinonediazidesulfonyl chloride. Preferable ratio of the dihydrochloric acid agent with respect to o-quinonediazidesulfonyl chloride is in a range of 0.95/1 to 1/0.95. The preferable reaction temperature is 0 to 40° C. and the preferable reaction time is 1 to 10 hours.

Examples of reaction solvents for use may include dioxane, acetone, methyl ethyl ketone, tetrahydrofuran, diethyl ether and N-methylpyrrolidone. Examples of the dihydrochloric acid agent may include sodium carbonate, sodium hydroxide, sodium hydrogen carbonate, potassium carbonate, potassium hydroxide, trimethylamine, triethylamine and pyridine.

[Component (c)]

The component (c) used in the present invention, i.e., the compound crosslinkable or polymerizable with the component (a) is not particularly limited as long as the compound has the structure represented by the general formula (3). As described above, it is preferable that the component (c) has a substituent that can efficiently form crosslink with the component (a). The temperature at which the component (c) can form crosslink is preferably 150° C. or higher so that the crosslink formation does not proceed in the steps of the application, drying, exposure and development of the photosensitive resin composition. In addition to forming crosslink with the terminal group of the component (a), the component (c) may also form intermolecular polymerization.

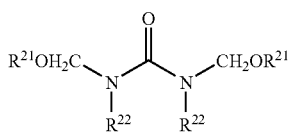

(3)

In the formula, a plurality of $R^{21}$ each independently represent a hydrogen atom or a monovalent organic group. A plurality of $R^{22}$ each independently represent a hydrogen atom or a monovalent organic group, and they may be bound one another to form a ring structure.

Preferable examples of those represented by the aforementioned general formula (3) may include compounds represented by the following general formulae (13).

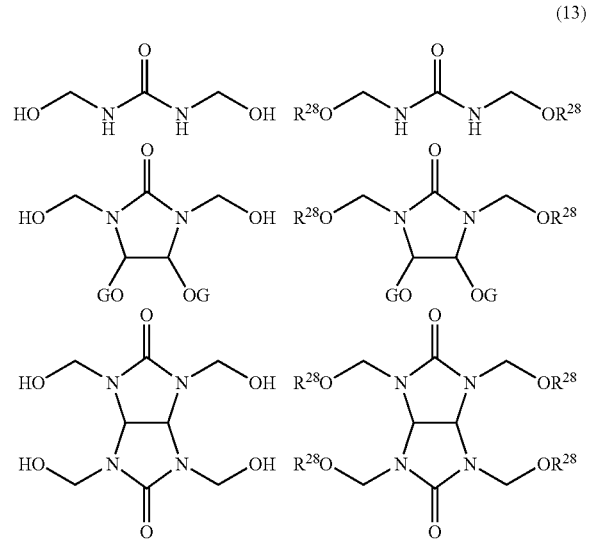

(13)

In the formulae, G represents a monovalent alkyl group having 1 to 10 carbon atoms, and a plurality of $R^{28}$ each independently represent a monovalent alkyl group having 1 to 20 carbon atoms.

The content of the component (c) used for the present invention is preferably 20 parts by weight or more based on 100 parts by weight of the component (a) in terms of chemical resistance and flux resistance of the cured film upon being cured at 220° C. or below. The content of the component (c) is preferably 5 to 100 parts by weight, more preferably 5 to 80 parts by weight and still more preferably 10 to 50 parts by weight based on 100 parts by weight of the component (a) in terms of balance with the photosensitive property.

Thus, the content of 20 to 50 parts by weight at which both the flux resistance and the balance with the photosensitive property are satisfied is particularly preferable and the content of 20 to 40 parts by weight is the most preferable.

[Other Components]

In addition to the aforementioned components (a) to (c), the positive photosensitive resin composition according to the present invention may contain (1) an acid generating compound, (2) a solubility inhibitor, (3) an adhesiveness-imparting agent, (4) a surfactant or a leveling agent and (5) a solvent.

(1) Acid Generating Compound

In order to facilitate the crosslinking reaction of the component (c), a compound that generates an acid by an acid catalyst or the heat may be co-used. As the acid used as the catalyst, a strong acid is preferable. Specifically, desirable ones are arylsulfonic acids such as p-toluenesulfonic acid and benzenesulfonic acid, perfluoroalkylsulfonic acids such as camphorsulfonic acid, trifluoromethanesulfonic acid and nonafluorobutanesulfonic acid, and alkylsulfonic acids such as methanesulfonic acid, ethanesulfonic acid and butanesulfonic acid. The compound that generates an acid by heat may be added into the positive photosensitive resin composition of the present invention in a form of a salt such as an onium salt or a form of a compound with a covalent bond such as imidosulfonate. It is desirable that the compound has a thermal decomposition starting temperature of 50 to 270° C.

Specifically, those having a 1% weight loss temperature of 50 to 270° C. or a 5% weight loss temperature of 60 to 300° C. measured by a thermogravimetric analysis (TGA) are desirable. Further, those having a thermal decomposition starting temperature of 140 to 250° C. are more preferable because such a compound does not generate an acid upon prebaking and does not have possibility to give a harmful effect to the photosensitive property. Specifically, those having a 1% weight loss temperature of 140 to 250° C. or a 5% weight loss temperature of 170 to 265° C. measured by the thermogravimetric analysis (TGA) are desirable. When the compound that generates an acid by the acid catalyst or heat is used, the amount of the compound to be used is preferably 10 parts by weight or less and more preferably 5 parts by weight or less based on 100 parts by weight of the component (a). When too much amount is added, the effect by the thermal decomposition upon prebaking might not be negligible.

(2) Solubility Inhibitor

The positive photosensitive resin composition according to the present invention may contain a compound that inhibits the solubility in order to control the solubility in the alkaline aqueous solution. Particularly, an onium salt, a diaryl compound and a tetraalkyl ammonium salt are preferable. Examples of the onium salt may include iodonium salts such as diaryl iodonium salts, sulfonium salts such as triaryl sulfonium salts, phosphonium salts, and diazonium salts such as aryl diazonium salts. Examples of the diaryl compound may include those obtained by binding two aryl groups through a binding group, e.g., diaryl urea, diaryl sulfone, diaryl ketone, diaryl ether, diaryl propane and diaryl hexafluoropropane. A phenyl group is preferable as the aryl group. Examples of the tetraalkyl ammonium salt may include tetraalkyl ammonium halides wherein the alkyl group is a methyl group or an ethyl group.

Among them, the compound that exhibits a good dissolution inhibitory effect may be the diaryl iodonium salts, the diaryl urea compounds, diaryl sulfone compounds and tetramethyl ammonium halide compounds. Examples of the diaryl urea compounds may include diphenyl urea and dimethyldiphenyl urea. Examples of the tetramethyl ammonium halide compounds may include tetramethyl ammonium chloride, tetramethyl ammonium bromide and tetramethyl ammonium iodide.

Preferable among them is a diaryl iodonium salt compound represented by the following general formula (14):

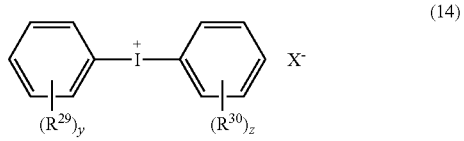

(14)

wherein $X^-$ represents a counter anion, $R^{29}$ and $R^{30}$ each independently represent a monovalent organic group, and y and z each independently represent an integer of 0 to 5. Examples of the anion may include a nitrate ion, a tetrafluoroboron ion, a perchlorate ion, a trifluoromethanesulfonate ion, a p-toluenesulfonate ion, a thiocyanate ion, a chlorine ion, a bromine ion and an iodine ion.

Examples of the aforementioned diaryl iodonium salt for use may include diphenyliodonium nitrate, bis(p-tert-butylphenyl)iodonium nitrate, diphenyliodonium trifluoromethanesulfonate, bis(p-tert-butylphenyl)iodonium trifluoromethanesulfonate, diphenyliodonium bromide, diphenyliodonium chloride and diphenyliodonium iodide.

Among them, preferable ones having a high effect are diphenyliodonium nitrate, diphenyliodonium trifluoromethanesulfonate and diphenyliodonium-8-anilinonaphthalene-1-sulfonate.

The amount for adding this solubility inhibitor is preferably 0.01 to 15 parts by weight, more preferably 0.01 to 10 parts by weight and still more preferably 0.5 to 8 parts by weight based on 100 parts by weight of the component (a) in terms of sensitivity and acceptable range of a development time.

(3) Adhesiveness-Imparting Agent

The positive photosensitive resin composition of the present invention may contain an adhesiveness-imparting agent such as an organic silane compound or an aluminum chelate compound in order to enhance the adhesiveness between the cured film and the substrate. Examples of the organic silane compound may include vinyltriethoxysilane, γ-glycidoxypropyltriethoxysilane, γ-methacryloxypropyltrimethoxysilane, urea propyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene and 1,4-bis(dibutylhydroxysilyl)benzene. Examples of the aluminum chelate compound may include tris(acetylacetonate)aluminum and acetyl acetate aluminum diisopropylate.

When the adhesiveness-imparting agent is used, the amount thereof is preferably 0.1 to 20 parts by weight and more preferably 0.5 to 10 parts by weight based on 100 parts by weight of the component (a).

(4) Surfactant or Leveling Agent

The positive photosensitive resin composition of the present invention may contain an appropriate surfactant or leveling agent in order to enhance a coating property, e.g. prevent a striation (unevenness of film thickness), and enhance the development property. Examples of such a surfactant and a leveling agent may include polyoxyethylene lauryl ether, polyoxyethylene stearyl ether, polyoxyethylene oleyl ether and polyoxyethylene octylphenol ether. Examples of commercially available products may include Megafac F171, F173 and R-08 (brand names supplied from Dainippon Ink And Chemicals, Inc.), Florard FC430 and FC431 (brand names supplied from Sumitomo 3M Ltd.), and organosiloxane polymers KP314, KBM303, KBM403 and KBM803 (brand names supplied from Shin-Etsu Chemical Co., Ltd.).

(5) Solvent

In the present invention, the aforementioned components are dissolved in a solvent to make a varnish form for the use. Examples of the solvent may include N-methyl-2-pyrrolidone, γ-butylolactone, N,N-dimethylacetamide, dimethylsulfoxide, 2-methoxyethanol, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol acetate, cyclohexanone, cyclopentanone and tetrahydrofuran. One species thereof may be used alone or mixture thereof may be used.

[Method for Producing Pattern]

Subsequently, the method for producing the pattern according to the present invention will be described. According to the method for producing the pattern according to the present invention, the desired pattern of the heat resistant polymer may be produced by: a step of applying and drying the aforementioned positive photosensitive resin composition on a support substrate to form a photosensitive resin film, a step of exposing to light the photosensitive resin film obtained by the step of applying and drying, a step of developing the photosensitive resin film using an alkaline aqueous solution for removing the photosensitive resin film in the light-exposed portion after the exposure, and a step of thermally treating the photosensitive resin film after the development. Each step will be described hereinbelow.

[Application and Drying (Film Forming) Step]

In the step of applying and drying the positive photosensitive resin composition on the support substrate, the aforementioned positive photosensitive resin composition is spin-coated using a spinner on a support substrate such as a glass substrate, a semiconductor, a metal oxide insulating material (e.g., $TiO_2$, $SiO_2$) or silicon nitride. Subsequently, the layer is dried using a hotplate or an oven, to form a photosensitive resin film that is the coating film of the positive photosensitive resin composition on the support substrate.

[Exposure Step]

Subsequently, in the exposure step, the photosensitive resin composition in a form of the coating film (photosensitive resin film) on the support substrate is irradiated with an active light ray such as ultraviolet light, visible light or radioactive ray through a mask.

[Development Step]

Subsequently, in the development step, a pattern is obtained by removing the exposed portion with a developer. Preferable examples of the developer may include alkaline aqueous solutions of sodium hydroxide, potassium hydroxide, sodium silicate, ammonia, ethylamine, diethylamine, triethylamine, triethanolamine or tetramethylammonium hydroxide. Preferable base concentration in this aqueous solution is 0.1 to 10% by weight. An alcohol and a surfactant may also be added to the aforementioned developer for use. These may be added at an amount in a range of preferably 0.01 to 10 parts by weight and more preferably 0.1 to 5 parts by weight based on 100 parts by weight of the developer.

[Heat Treatment Step]

In the subsequent heat treatment step, the resulting pattern is treated with heat at preferably 150 to 450° C. using a furnace such as a variety of heat diffusion furnaces heating furnaces or curing furnaces, to obtain a pattern of a heat resistant polymer. In the present invention, heat treatment performed at even 250° C. or below, preferably 150 to 220° C. may give a sufficient film property.

[Microwave Curing]

The heat treatment is not limited to the treatment with the heat diffusion furnace or other furnaces, but may also include a treatment with microwave. Preferably irradiation with the microwave is performed in a pulse waveform with changing its frequency, because thereby a standing wave can be prevented and the substrate surface can be uniformly heated. When the substrate includes a metal wiring such as an electronic component, it is preferable that the irradiation with microwave is performed in a pulse waveform with changing its frequency because thereby electric discharge from the metal can be prevented and the electronic components can be protected from breakdown.

The frequency of the microwave for irradiation may be in a range of 0.5 to 2.0 GHz, although frequency for practical use is preferably in a range of 1 to 10 GHz and more preferably 2 to 9 GHz.

It is desirable to continuously change the frequency of the microwave for irradiation, although actual changing of the microwave frequency is performed in a step-wise manner. During the irradiation with such a microwave, a period of time for irradiating the microwave with a stable frequency is preferably minimized because thereby the standing wave and the electric discharge from the metal can be minimized. This period of time is preferably one millisecond or less and particularly preferably 100 microseconds or less.

The output power for the microwave irradiation may vary depending on the size of the apparatus and the amount of the subject to be heated, although the output power is approximately in a range of 10 to 2000 W, and practical output power is preferably 100 to 1000 W, still more preferably 100 to 700 W and the most preferably 100 to 500 W. When the output power is 10 W or less, it is difficult to heat the subject to be heated in a short period of time. When the output is 2000 W or more, a too fast temperature elevation may occur.

It is preferable that the microwave to be applied to the positive photosensitive resin composition of the present invention is in a pulsed on/off manner. It is preferable to perform the microwave irradiation with such a pulsed manner because thereby a predetermined heating temperature can be kept and damage to the polyimide thin film and the substrate can be avoided. The period of time for continuous application of one pulse microwave may vary depending on the conditions, but is approximately 10 seconds or shorter.

The period of time for thermal curing of the positive photosensitive resin composition of the present invention is a period of time for completing evaporation of the remaining solvent and the volatile component, and is approximately 5 hours or shorter in terms of balance with a working efficiency. The atmosphere for heat treatment may be selected from an ambient atmosphere and an atmosphere under inert gas such as nitrogen.

[Steps for Producing Semiconductor Device]

Subsequently, as one example of the method for producing the pattern using the positive photosensitive resin composition according to the present invention, an example of steps for producing a semiconductor device (electronic component) will be described with reference to the drawings. FIGS. 1 to 5 are schematic cross sectional views illustrating the steps of producing the semiconductor device having a multilayer wiring structure.

In these FIGS. 1 to 5, a protection film 2 such as a silicon oxidized film covers a semiconductor substrate 1 such as an Si substrate having a circuit element (not shown in the figures), although a predetermined portion of the circuit element is uncovered. On the uncovered circuit element, a first conductor layer 3 is formed. On this semiconductor substrate 1, an interlayer insulation film layer 4 of the positive photosensitive resin composition as an interlayer insulation film is formed by a method such as spin coating method (FIG. 1).

Figure 2:
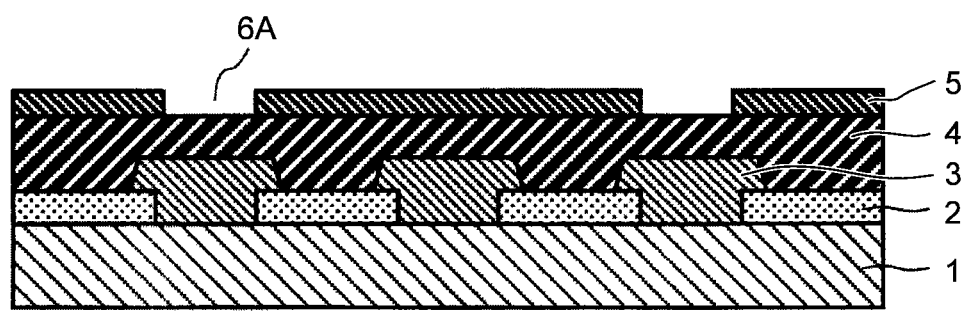
FIG. 2 is a schematic cross sectional view illustrating a step of producing a semiconductor device having a multilayer wiring structure in an embodiment of the present invention.
Figure 3:
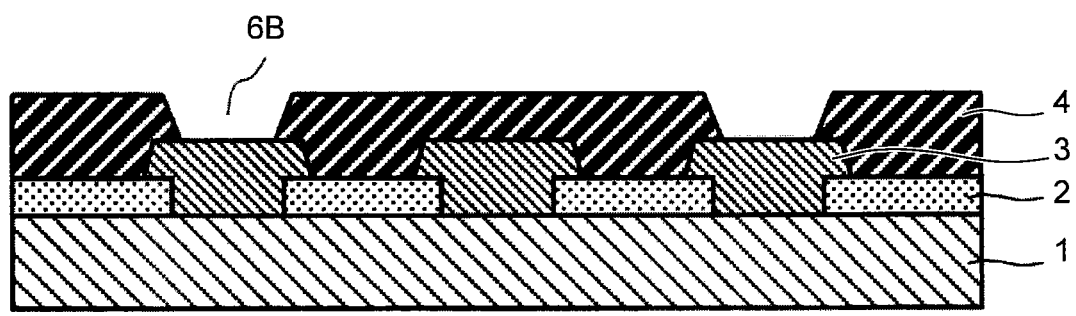
FIG. 3 is a schematic cross sectional view illustrating a step of producing a semiconductor device having a multilayer wiring structure in an embodiment of the present invention.

Then, a chlorinated rubber-based or phenol novolak-based photosensitive resin layer 5 is formed on the interlayer insulation film layer 4 by spin coating method, and a window 6A is provided by a publicly known photo-etching technology so that the interlayer insulation film layer 4 in the predetermined portion is uncovered (FIG. 2). The interlayer insulation film 4 uncovered in the window 6A is selectively etched by a dry etching procedure using a gas of oxygen or carbon tetrafluoride to open a window 6B. Then, the photosensitive resin layer 5 is completely removed using an etching solution that corrodes the photosensitive resin layer 5 alone without corroding the first conductor layer 3 uncovered in the window 6B (FIG. 3).

Figure 4:
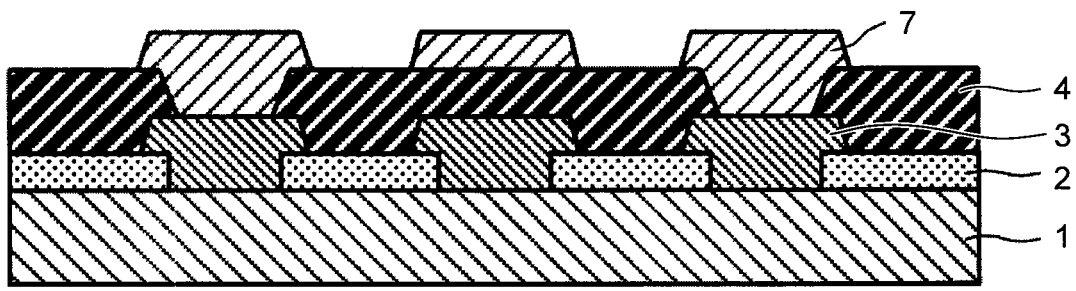
FIG. 4 is a schematic cross sectional view illustrating a step of producing a semiconductor device having a multilayer wiring structure in an embodiment of the present invention.

Further, a second conductor layer 7 is formed using a publicly known photo-etching technology, and is electrically connected with the first conductor layer 3 completely (FIG. 4). When a multilayer wiring structure having three or more layers is desired to be formed, the aforementioned steps may be repeated to form the respective layers.

Figure 5:
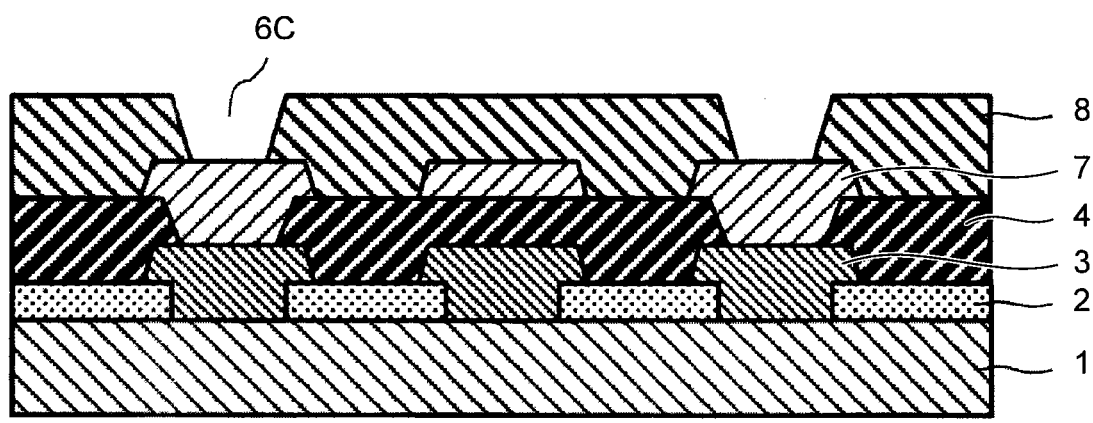
FIG. 5 is a schematic cross sectional view illustrating a step of producing a semiconductor device having a multilayer wiring structure in an embodiment of the present invention.

Then, a surface protection film layer 8 is formed. In the examples in FIGS. 1 to 5, the aforementioned photosensitive resin composition is applied by spin coating method, and the layer is dried, irradiated with light through a mask having a pattern to form a window 6C in a predetermined portion, developed in the alkaline aqueous solution to form the pattern, and heated, to make a heat resistant polymer film as the surface protection film layer 8 (FIG. 5). This heat resistant polymer film as the surface protection film layer 8 protects the conductor layer from a stress and alpha ray coming from the outside, for improving reliability of the resulting semiconductor device. In the aforementioned examples, not only the surface protection film layer 8 but also the interlayer insulation film layer 4 may be formed using the positive photosensitive resin composition of the present invention.

[Electronic Component]

Subsequently, the electronic component according to the present invention will be described. The positive photosensitive resin composition of the present invention may be used for electronic component such as a semiconductor device and a multilayer wiring plate, specifically, for forming a surface protection film, a rewiring layer and an interlayer insulation film of the semiconductor device, and an interlayer insulation film of the multilayer wiring plate. The semiconductor device of the present invention is not particularly limited as long as it has the surface protection film, the rewiring layer or the interlayer insulation film formed using the positive photosensitive resin composition, and may take a variety of structures. The electronic component according to the present invention includes the pattern formed by the method for producing the pattern using the positive photosensitive resin composition of the present invention. The electronic component includes a semiconductor device, a multilayer wiring plate and a variety of electronic devices.

EXAMPLES

The present invention will be described more specifically hereinbelow with referring to Examples and Comparative Examples, but the present invention is not limited to these Examples. The weight average molecular weight of the polymer synthesized in Examples and Comparative Examples was obtained in terms of standard polystyrene using a gel permeation chromatography method (GPC method, the apparatus therefor was supplied from Hitachi Ltd., and a column was Gel Pac supplied from Hitachi Chemical Co., Ltd.).

Examples 1 to 13

Synthesis Example 1

Synthesis of Polybenzoxazole Precursor

In a 0.5 liter flask equipped with a stirrer and a thermometer, 15.48 g (60 mmol) of 4,4'-diphenyl ether dicarboxylic acid and 90 g of N-methylpyrrolidone were placed. The flask was cooled to 5° C., and subsequently 23.9 g (120 mmol) of thionyl chloride was added dropwise. The mixture was reacted for 30 minutes to obtain a solution of 4,4'-diphenyl ether dicarboxylic acid chloride. Then, in a 0.5 liter flask equipped with a stirrer and a thermometer, 87.5 g of N-methylpyrrolidone was placed, into which 18.30 (50 mmol) of bis(3-amino-4-hydroxyphenyl)hexafluoropropane was dissolved with stirring. Subsequently 9.48 g (120 mmol) of pyridine was added. Then the solution of 4,4'-diphenyl ether dicarboxylic acid chloride was added dropwise over 30 minutes with keeping the temperature at 0 to 5° C., and then the stirring was continued for 30 minutes. The solution was poured into 3 liters of water. A precipitate was collected, which was then washed 3 times with pure water and dried under reduced pressure, to obtain polyhydroxyamide having a carboxyl group at a terminus (hereinafter referred to as Polymer I). The weight average molecular weight of Polymer I obtained in terms of standard polystyrene by GPC method was 17,600 and the dispersion degree of Polymer I was 1.6.

Synthesis Example 2

In a 0.5 liter flask equipped with a stirrer and a thermometer, 15.48 g (60 mmol) of 4,4'-diphenyl ether dicarboxylic acid and 90 g of N-methylpyrrolidone were placed. The flask was cooled to 5° C., and subsequently 23.9 g (120 mmol) of thionyl chloride was added dropwise. The mixture was reacted for 30 minutes to obtain a solution of 4,4'-diphenyl ether dicarboxylic acid chloride. Then, in a 0.5 liter flask equipped with a stirrer and a thermometer, 87.5 g of N-methylpyrrolidone was placed. 18.30 (50 mmol) of bis(3-amino-4-hydroxyphenyl)hexafluoropropane and 2.46 g (20 mmol) of m-aminoanisole were added and dissolved therein with stirring. Subsequently 9.48 g (120 mmol) of pyridine was added. Then the solution of 4,4'-diphenyl ether dicarboxylic acid chloride was added dropwise over 30 minutes with keeping the temperature at 0 to 5° C., and then the stirring was continued for 30 minutes. The solution was poured into 3 liters of water, and a precipitate was collected, washed 3 times with pure water and dried under reduced pressure to obtain polyhydroxyamide having methoxy-substituted benzene at a terminus (hereinafter referred to as Polymer II). The weight average molecular weight of Polymer II obtained in terms of standard polystyrene by GPC method was 19,100 and the dispersion degree of Polymer II was 1.6.

Synthesis Examples 3 to 11

Synthesis was conducted in the same condition as in Synthesis Example 2, except that dicarboxylic acid and m-aminoanisole for the terminal group used in Synthesis Example 2 were changed as shown in Table 1. The weight average molecular weight obtained in terms of standard polystyrene by GPC method and the dispersion degree of the obtained polymer are shown in Table 2 together with the polymer number.

TABLE 1

| | Dicarboxylic acid | Terminal group |
|---|---|---|
| Syn. Ex. 3 | Same as Syn. Ex. 2 | m-Aminophenol |
| Syn. Ex. 4<br>Syn. Ex. 5 | HOOC—C₆H₄—O—C₆H₄—O—C₆H₄—COOH | Aniline<br>p-Toluidine |
| Syn. Ex. 6<br>Syn. Ex. 7 | HOOC—CH₂—C₆H₄—CH₂—COOH | m-Aminoanisole<br>m-Aminophenol |
| Syn. Ex. 8<br>Syn. Ex. 9 | HOOC—C₆H₁₀—COOH | m-Aminophenol<br>p-Toluidine |

TABLE 1-continued

| | Dicarboxylic acid | Terminal group |
|---|---|---|
| Syn. Ex. 10 | HOOC—(CH$_2$)$_3$—Si—O—Si—(CH$_2$)$_3$—COOH | Aniline |
| Syn. Ex. 11 | | m-Aminophenol |

TABLE 2

| | Polymer No. | Weight average molecular weight | Dispersion degree |
|---|---|---|---|
| Syn. Ex. 3 | Polymer III | 23,400 | 1.8 |
| Syn. Ex. 4 | Polymer IV | 17,800 | 2.1 |
| Syn. Ex. 5 | Polymer V | 18,100 | 1.9 |
| Syn. Ex. 6 | Polymer VI | 20,100 | 2.2 |
| Syn. Ex. 7 | Polymer VII | 21,400 | 2.2 |
| Syn. Ex. 8 | Polymer VIII | 24,400 | 1.9 |
| Syn. Ex. 9 | Polymer IX | 24,400 | 2.3 |
| Syn. Ex. 10 | Polymer X | 15,700 | 1.9 |
| Syn. Ex. 11 | Polymer XI | 13,300 | 1.8 |

(Evaluation of Photosensitive Property)

A component (b) and a component (c) in predetermined amounts shown in Table 3 were mixed with 100 parts by weight of the Polymer I to XI as a component (a). As an organic solvent, which is the solvent, γ-butylolactone (BLO) or N-methyl-2-pyrrolidine (NMP) was used at the amount by parts by weight shown in Table 3.

TABLE 3

| | Component (a) | Component (b) | Component (c) | Component (d) |
|---|---|---|---|---|
| Ex. 1 | Polymer I | B1(10) | C1(12) | BLO(150) |
| Ex. 2 | Polymer I | B1(10) | C2(20) | BLO(150) |
| Ex. 3 | Polymer II | B2(10) | C3(15) | BLO(150) |
| Ex. 4 | Polymer III | B1(10) | C1(10) | BLO(150) |
| Ex. 5 | Polymer III | B1(10) | C1(30) | BLO(150) |
| Ex. 6 | Polymer IV | B2(10) | C2(20) | NMP(150) |
| Ex. 7 | Polymer V | B1(10) | C3(15) | NMP(150) |
| Ex. 8 | Polymer VI | B2(10) | C1(30) | NMP(150) |
| Ex. 9 | Polymer VII | B1(10) | C2(30) | NMP(150) |
| Ex. 10 | Polymer VIII | B2(10) | C3(35) | NMP(150) |
| Ex. 11 | Polymer IX | B1(10) | C1(30) | NMP(150) |
| Ex. 12 | Polymer X | B2(10) | C2(30) | NMP(150) |
| Ex. 13 | Polymer XI | B1(10) | C1(30) | NMP(150) |

In Table 3, numerals in parentheses indicate the added amount shown by parts by weight based on 100 parts by weight of the polymer. In Table 3, B1 and B2 used as the component (b) and C1 to C3 used as the component (c) are compounds represented by the following chemical formulae (15) and (16).

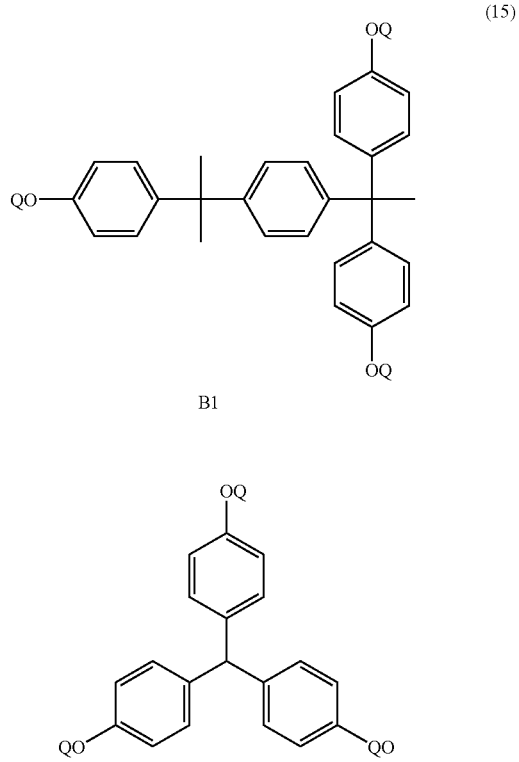

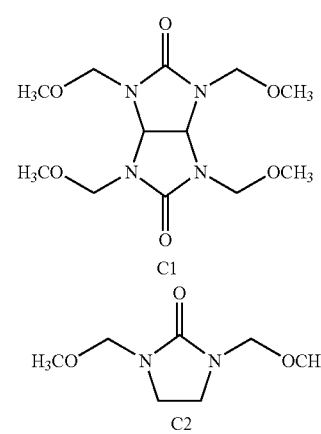

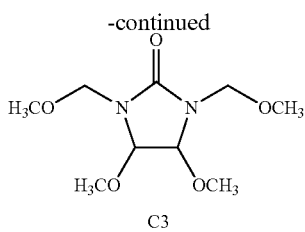

C3

The solution of the positive photosensitive resin composition obtained as described above was spin-coated on a silicon wafer to form a coating film having a dry film thickness of 7 to 12 μm, which was then exposed to i ray at 100 to 1000 mJ/cm$^2$ using an ultrahigh pressure mercury lamp through an interference filter. After the exposure, the coating film was heated at 120° C. for 3 minutes. Then development was performed in an aqueous solution of 2.38% by weight of tetramethylammonium hydroxide until the residual film thickness rate of the portion unexposed to light reached about 80%. The film was subsequently rinsed with water, to thereby obtain a pattern. Under all of the conditions used in Examples, good pattern having a minimum opening light-exposure amount of 500 mJ/cm$^2$ or less and a resolution of 6 μm or less was formed.

Subsequently, the solution of the positive photosensitive resin composition was spin-coated on the silicon wafer and heated at 120° C. for 3 minutes to form a coating film having a film thickness of 15 μm.

After that, the coating film was heated under a nitrogen atmosphere in an inert gas oven at 150° C. for 30 minutes, and further at 320° C. for one hour or 200° C. for one hour, to obtain a cured film. This cured film was immersed in NMP at room temperature for 15 minutes, and the appearance and the film thickness change thereof were examined. The cured film was also immersed in an aqueous solution of 30% by weight of NaOH at 50° C. for 10 minutes, and the appearance and the film thickness change thereof were examined. Apart from these evaluations, the obtained film together with the silicon substrate was immersed in an aqueous solution of hydrofluoric acid, and the cured film was delaminated from the substrate. The delaminated cured film was washed with water and dried, and then a breaking elongation (measured using a tensile tester) was measured. These results are shown in Table 4. In Table 4, when the film thickness change before and after the immersion in the solvent was increased or decreased by 1 μm or less, such an example was indicated as "No change".

TABLE 4

| | Curing temperature (° C.) | Chemical resistance (appearance and film thickness change) | | Breaking elongation (%) |
| --- | --- | --- | --- | --- |
| | | NMP | NaOH aqueous solution | |
| Example 1 | 320 | Film thickness + 1.8 μm | No change | 31 |
| | 200 | Film thickness + 4.6 μm | No change | 14 |
| Example 2 | 320 | No change | No change | 25 |
| | 200 | Film thickness + 1.8 μm | No change | 12 |
| Example 3 | 320 | Film thickness + 1.2 μm | No change | 53 |
| | 200 | Film thickness + 5.8 μm | Minute cracks | 30 |
| Example 4 | 320 | Film thickness + 2.7 μm | No change | 60 |
| | 200 | Film thickness + 4.1 μm | No change | 21 |
| Example 5 | 320 | No change | No change | 52 |
| | 200 | No change | No change | 34 |
| Example 6 | 320 | No change | No change | 42 |
| | 200 | Film thickness + 1.4 μm | Minute cracks | 20 |
| Example 7 | 320 | Film thickness + 1.8 μm | No change | 47 |
| | 200 | Film thickness + 4.9 μm | Minute cracks | 18 |
| Example 8 | 320 | No change | No change | 25 |
| | 200 | No change | No change | 16 |
| Example 9 | 320 | No change | No change | 26 |
| | 200 | No change | No change | 15 |
| Example 10 | 320 | No change | No change | 60 |
| | 200 | Film thickness + 2.0 μm | No change | 35 |
| Example 11 | 320 | No change | No change | 59 |
| | 200 | Film thickness + 1.5 μm | Minute cracks | 27 |
| Example 12 | 320 | No change | No change | 23 |
| | 200 | Film thickness + 1.8 μm | No change | 11 |
| Example 13 | 320 | No change | No change | 38 |
| | 200 | Film thickness + 2.0 μm | No change | 19 |

As shown in Table 4, when the film was cured at 320° C., the resistance of the films to the aqueous solution of NaOH was good in every examples. It was found that, by containing the component (c) in the amount of 20 parts by weight or more, the film cured at 200° C. had a mechanical property and a chemical resistance at a level that causes no problem in use.

Examples 14 to 17

Further, the materials of Examples 2, 5, 8 and 13 which are shown in Table 3 were examined with an altered curing method. A solution of the positive photosensitive resin composition was spin-coated on a silicon wafer and heated at 120° C. for 3 minutes to form a coating film having a film thickness of 15 μm. The coating film was then cured with a microwave output power of 450 W and microwave frequency of 5.9 to 7.0 GHz using Microcure 2100 supplied from Lambda Technology with keeping a substrate temperature at 160° C. for 2 hours to obtain a cured film having a film thickness of about 10 μm.

Then, this cured film was delaminated using the aqueous solution of hydrofluoric acid, washed with water and dried. Then, a breaking elongation was measured. These results are shown in Table 5.

TABLE 5

| | Material | Curing temperature (° C.) | Breaking elongation (%) |
| --- | --- | --- | --- |
| Ex. 14 | Same as Example 2 | 160 | 17 |
| Ex. 15 | Same as Example 5 | 160 | 25 |

TABLE 5-continued

| | Material | Curing temperature (° C.) | Breaking elongation (%) |
|---|---|---|---|
| Ex. 16 | Same as Example 8 | 160 | 16 |
| Ex. 17 | Same as Example 13 | 160 | 21 |

As described above, it has been found that the positive photosensitive resin composition gives the perfect physical property also by the method of curing by irradiating the composition with the microwave in the pulsed pattern with changing the frequency and with keeping the substrate temperature at 160° C.

Comparative Examples 1 to 6

Synthesis Example 12

Synthesis of Polyimide Precursor

In a 0.2 liter flask equipped with a stirrer and a thermometer, 10 g (32 mmol) of 3,3',4,4'-diphenyl ether tetracarboxylic dianhydride (ODPA) and 3.87 g (65 mmol) of isopropyl alcohol were dissolved in 45 g of N-methylpyrrolidone. Then a catalyst amount of 1,8-diazabicycloundecene was added thereto. The mixture was heated at 60° C. for 2 hours, and subsequently stirred at room temperature (25° C.) for 15 hours to conduct esterification. After the esterification, 7.61 g (64 mmol) of thionyl chloride was added under ice cooling. Then the temperature was elevated back to the room temperature, and the reaction was performed for 2 hours to obtain a solution of acid chloride. This solution will be referred to as an acid chloride solution I.

Then, in a 0.5 liter flask equipped with a stirrer and a thermometer, 40 g of N-methylpyrrolidone was placed. 10.25 g (28 mmol) of bis(3-amino-4-hydroxyphenyl)hexafluoropropane was added and dissolved with stirring. Then, 7.62 g (64 mmol) of pyridine was added thereto. The acid chloride solution I previously prepared was added dropwise over 30 minutes with keeping the temperature at 0 to 5° C., and then the stirring was continued for 30 minutes. This reaction solution was added dropwise into distilled water. A precipitate was filtrated and collected, and dried under reduced pressure to obtain polyamide acid ester having a carboxyl group at a terminus (hereinafter referred to as Polymer XII). Its weight average molecular weight was 19,400 and its dispersion degree was 2.2.

A component (b) and a component (c) in predetermined amounts shown in Table 6 were mixed with 100 parts by weight of the Polymer as a component (a). In the following, the photosensitive property was evaluated in the same manner as in Examples.

TABLE 6

| | Component (a) | Component (b) | Component (c) | Solvent |
|---|---|---|---|---|
| Comp. Ex. 1 | Polymer II | None | C1(30) | BLO(150) |
| Comp. Ex. 2 | Polymer II | B2(10) | None | BLO(150) |
| Comp. Ex. 3 | Polymer III | B1(10) | C4(10) | BLO(150) |
| Comp. Ex. 4 | Polymer III | B2(10) | C5(15) | NMP(150) |
| Comp. Ex. 5 | Polymer XII | B1(10) | C1(15) | BLO(150) |

As shown in Table 6, Comparative Example 1 was unable to form pattern. As to other Comparative Examples, although image was formed, the sensitivity and the resolution were observed to be reduced.

Subsequently, the properties of the cured film in Comparative Examples 1 to 5 was measured in the same manner as above. The results are shown in Table 7.

TABLE 7

| | Curing temperature (° C.) | Chemical resistance (appearance and film thickness change) | | Breaking elongation (%) |
|---|---|---|---|---|
| | | NMP | NaOH aqueous solution | |
| Comp. Ex. 1 | 320 | No change | No change | 50 |
| | 200 | Film thickness + 1.3 μm | No change | 21 |
| Comp. Ex. 2 | 320 | Crack occurred | Pattern delamination | Too brittle to measure |
| | 200 | Crack occurred | Crack occurred | Too brittle to measure |
| Comp. Ex. 3 | 320 | Film thickness + 1.8 μm | Pattern delamination | 45 |
| | 200 | Film thickness + 3.6 μm | Pattern delamination | 28 |
| Comp. Ex. 4 | 320 | Film thickness + 2.1 μm | Pattern delamination | 58 |
| | 200 | Film thickness + 4.0 μm | Crack occurred | 21 |
| Comp. Ex. 5 | 320 | Film thickness + 5.0 μm | Pattern delamination | 16 |
| | 200 | Film thickness + 7.8 μm | Crack occurred | Too brittle to measure |

As shown in Table 7, when no component (c) was used or when the compound therein was different from the compound having the structure of the present invention (Comparative Examples 2 to 4), the resistance, particularly the resistance to the aqueous solution of NaOH, was drastically reduced. When the polyimide precursor polymer was employed as the polymer, the crosslinking reaction did not proceed sufficiently, and therefore resulted in low overall chemical resistance and low breaking elongation.

INDUSTRIAL APPLICABILITY

As described above, the positive photosensitive resin composition according to the present invention gives a cured film that is excellent in resistance to a strong alkaline aqueous solution, an organic solvent and a flux. Further, even when the heat treatment is performed at low temperature of 220° C. or below, the same good cured film properties as one treated at higher temperature is obtained. Also according to the method for producing the pattern of the present invention, a pattern that is excellent in heat resistance and has a good shape is obtained by using the aforementioned composition. Further, the electronic component of the present invention is highly reliable by having the pattern having the good shape and property. Therefore, the present invention is useful as an electronic component such as electronic devices.

The invention claimed is:

1. A positive photosensitive resin composition comprising:
   (a) a polybenzoxazole or a polybenzoxazole precursor polymer having a structural unit represented by either a general formula (1) or (2),

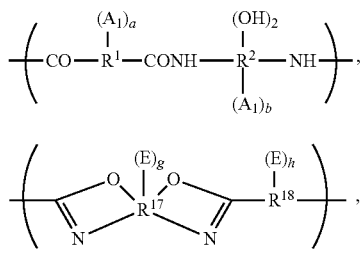

(1)

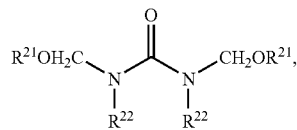

(2)

and satisfying following conditions (i) or (ii), or (i) and (ii);
(b) a compound that generates an acid when irradiated with an active light ray; and
(c) a compound having a structure represented by a general formula (3) crosslinkable or polymerizable with the component (a) upon applying heat;

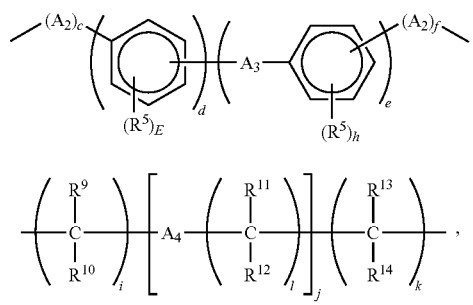

(3)

wherein content of the component (c) is 20 to 50 parts by weight based on 100 parts by weight of the component (a);
wherein $R^1$ represents a (2+a)-valent group containing an aromatic ring structure, an alicyclic structure having 4 to 20 carbon atoms, a siloxane structure, or an alkylsilyl structure;
$R^2$ represents (4+b)-valent group;
$A_1$ is selected from $OR^3$, $SO_3R^3$, $CONR^3R^4$, $COOR^3$, and $SO_2NR^3R^4$, from which, when a plurality of $A_1$ are present, each $A_1$ is independently selected;
$R^3$ and $R^4$ represent a hydrogen atom or a monovalent hydrocarbon group having 1 to 20 carbon atoms; and
a and b each independently represent an integer of 0 to 4;
wherein at least one of $R^1$ and $R^2$ represents a group containing the structure represented by the general formula (I) or (II) shown below, or a group containing an alicyclic structure having 4 to 20 carbon atoms;

(I)

(II)

wherein c and f each independently represent an integer of 0 to 1;
d and e each independently represent an integer of 0 to 6, and d+e>0;
g and h each independently represent an integer of 0 to 4;
$A_2$ and $A_3$ each independently represent a group containing the structure represented by $—(CR^6{}_2)_n—$, $—O—$, $—S—$, $—SO_2—$, $—CO—$, $—NHCO—$, $—C(CF_3)_2—$, $—C(R^6)_2—$, $—Si(R^6)_2—$, $—OSi(R^6)_2—$, $—Si(R^6)_2O—$, $—OSi(R^6)_2O—$, $—Si(R^6)_2O—Si(R^6)_2—$ or $—R^7C=CR^8—$, and
n represents an integer of 1 to 20;
a plurality of $R^5$ each independently represent a hydrogen atom, a hydroxyl group or a monovalent hydrocarbon group having 1 to 20 carbon atoms; and
$R^6$, $R^7$ and $R^8$ each independently represent a hydrogen atom or a monovalent hydrocarbon group having 1 to 20 carbon atoms;
wherein $R^9$ to $R^{14}$ each independently represent hydrogen, fluorine or an alkyl group having 1 to 6 carbon atoms;
i, j and k each independently represent an integer of 0 to 6;
l represents an integer of 0 to 3 with a proviso that i+k>0;
$A_4$ represents a group containing the structure represented by $—O—$, $—S—$, $—SO_2—$, $—CO—$, $—NHCO—$, $—C(CF_3)_2—$, $—C(R^6)_2—$, $—Si(R^6)_2—$, $—OSi(R^6)_2—$, $—Si(R^6)_2O—$, $—OSi(R^6)_2O—$, $—Si(R^6)_2O—Si(R^6)_2—$, $—C≡C—$ or $—R^{15}C=CR^{16}—$;
$R^6$ each independently represent a hydrogen atom or a monovalent hydrocarbon group having 1 to 20 carbon atoms; and
$R^{15}$ to $R^{16}$ each independently represent hydrogen, fluorine or an alkyl group having 1 to 6 carbon atoms;
wherein $R^{17}$ represents a (4+g)-valent group;
$R^{18}$ represents a (2+h)-valent group containing an aromatic ring structure, an alicyclic structure having 4 to 20 carbon atoms, a siloxane structure or an alkylsilyl structure;
at least one of $R^{17}$ and $R^{18}$ has the structure represented by said general formula (I) or (II) or an alicyclic structure having 4 to 20 carbon atoms;
a plurality of E may be the same or different, and are selected from $OR^{19}$, $SO_3R^{19}$, $CONR^{19}R^{20}$, $COOR^{20}$ and $SO_2NR^{19}R^{20}$;
$R^{19}$ and $R^{20}$ represent a hydrogen atom or a monovalent hydrocarbon group having 1 to 10 carbon atoms; and
g and h represents an integer of 0 to 4 with a proviso that g+h>0; wherein
Condition (i) is when, as a terminal group, the component (a) has a functional group reactable with said component (c) upon being thermally cured, and
Condition (ii) is when the component (a) includes the structure represented by the general formula (I), if c+f=0 in the general formula (I), d+e≧3;
wherein a plurality of $R^{21}$ each independently represent a hydrogen atom or a monovalent organic group; and
a plurality of $R^{22}$ each independently represent a hydrogen atom or a monovalent organic group, and the plurality of $R^{22}$ may be bound one another to form a ring structure.

2. The positive photosensitive resin composition according to claim 1, wherein said component (a) has, as the terminal group, the functional group reactable with said component (c) upon being thermally cured.

3. The positive photosensitive resin composition according to claim 1, wherein said component (b) is an o-quinonediazide compound.

4. A method for producing a pattern, comprising the steps of:
applying and drying the positive photosensitive resin composition according to claim 1 on a support substrate to form a photosensitive resin film;
exposing to light the photosensitive resin film obtained by applying and drying the positive photosensitive resin composition;

developing the photosensitive resin film using an alkaline aqueous solution for removing a light-exposed portion of the photosensitive resin film after said exposure; and
thermally treating the photosensitive resin film after said development.

5. An electronic component having an electronic device having a layer of a pattern obtained by the method for producing the pattern according to claim 4, wherein the layer of said pattern is provided as an interlayer insulation film layer, a rewiring layer, or a surface protection film layer in said electronic device.

* * * * *